US010472562B2

(12) United States Patent
Lee et al.

(10) Patent No.: US 10,472,562 B2
(45) Date of Patent: Nov. 12, 2019

(54) QUANTUM DOT-POLYMER MICRONIZED COMPOSITE, PRODUCTION METHOD THEREOF, AND ARTICLE AND ELECTRONIC DEVICE INCLUDING THE SAME

(71) Applicant: SAMSUNG ELECTRONICS CO., LTD., Suwon-si, Gyeonggi-do (KR)

(72) Inventors: Jeong Hee Lee, Seongnam-si (KR); Hyun A Kang, Suwon-si (KR); Tae Hyung Kim, Seoul (KR); Eun Joo Jang, Suwon-si (KR); Nayoun Won, Suwon-si (KR); Jiho You, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 391 days.

(21) Appl. No.: 15/378,791

(22) Filed: Dec. 14, 2016

(65) Prior Publication Data

US 2017/0174984 A1    Jun. 22, 2017

(30) Foreign Application Priority Data

Dec. 17, 2015 (KR) .................. 10-2015-0181292

(51) Int. Cl.
*C09K 11/02* (2006.01)
*B05D 3/00* (2006.01)
(Continued)

(52) U.S. Cl.
CPC ............ *C09K 11/025* (2013.01); *B05D 3/007* (2013.01); *C08K 3/16* (2013.01); *C08K 3/32* (2013.01); *C08K 9/04* (2013.01); *C08L 23/0869* (2013.01); *C09K 11/02* (2013.01); *C09K 11/70* (2013.01); *C09K 11/883* (2013.01); *H01L 33/502* (2013.01); *H01L 33/56* (2013.01);
(Continued)

(58) Field of Classification Search
CPC .......... C09K 1/02; C09K 1/025; C09K 1/883; C08K 5/16; C08K 9/04; H01L 33/502
See application file for complete search history.

(56) References Cited

U.S. PATENT DOCUMENTS

| 6,548,171 | B1 | 4/2003 | Barbera-Guillem et al. |
| 8,618,212 | B2 | 12/2013 | Liu et al. |

(Continued)

FOREIGN PATENT DOCUMENTS

| KR | 1020120137136 A | 12/2012 |
| KR | 1020150018693 A | 2/2015 |

OTHER PUBLICATIONS

Extended European Search Report dated Jun. 1, 2017, of the corresponding European Patent Application No. 16203759.2.

*Primary Examiner* — C Melissa Koslow
(74) *Attorney, Agent, or Firm* — Cantor Colburn LLP

(57) ABSTRACT

A quantum dot-polymer micronized composite includes a first polymer matrix; a plurality of quantum dots dispersed in the first polymer matrix; and at least one of an additive selected from a clay particle embedded in the first polymer matrix and a metal halide dispersed in the first polymer matrix, wherein the quantum dot-polymer micronized composite has an average particle size of less than or equal to about 100 micrometers, a production method thereof, and an article and an electronic device including the micronized composite are provided.

27 Claims, 16 Drawing Sheets
(5 of 16 Drawing Sheet(s) Filed in Color)

(51) Int. Cl.
  *C08K 3/16*   (2006.01)
  *C08K 3/32*   (2006.01)
  *C08K 9/04*   (2006.01)
  *C08L 23/08*  (2006.01)
  *C09K 11/70*  (2006.01)
  *C09K 11/88*  (2006.01)
  *H01L 33/50*  (2010.01)
  *H01L 33/56*  (2010.01)
  *B82Y 20/00*  (2011.01)
  *B82Y 40/00*  (2011.01)

(52) U.S. Cl.
  CPC ............... *B82Y 20/00* (2013.01); *B82Y 40/00* (2013.01); *C08K 2201/001* (2013.01); *C08K 2201/005* (2013.01); *C08K 2201/011* (2013.01); *H01L 33/501* (2013.01); *H01L 2933/005* (2013.01); *H01L 2933/0041* (2013.01); *Y10S 977/774* (2013.01); *Y10S 977/892* (2013.01); *Y10S 977/95* (2013.01)

(56) References Cited

U.S. PATENT DOCUMENTS

| | | | |
|---|---|---|---|
| 9,034,978 | B2 | 5/2015 | Thalappil et al. |
| 9,070,838 | B2 | 6/2015 | Jang et al. |
| 2007/0045777 | A1 | 3/2007 | Gillies et al. |
| 2011/0076483 | A1* | 3/2011 | Ryowa ................. C09K 11/025 428/328 |
| 2013/0062591 | A1* | 3/2013 | Jun ....................... H01L 33/505 257/9 |
| 2013/0105854 | A1 | 5/2013 | Jang et al. |
| 2015/0041715 | A1 | 2/2015 | Lee et al. |
| 2016/0160060 | A1* | 6/2016 | Kikuchi .................... C08F 2/38 313/503 |

\* cited by examiner

QUANTUM DOT-POLYMER MICRONIZED COMPOSITE, PRODUCTION METHOD THEREOF, AND ARTICLE AND ELECTRONIC DEVICE INCLUDING THE SAME

CROSS-REFERENCE TO RELATED APPLICATION

This application claims priority to and the benefit of Korean Patent Application No. 10-2015-0181292 filed in the Korean Intellectual Property Office on Dec. 17, 2015, and all the benefits accruing therefrom under 35 U.S.C. § 119, the entire content of which is incorporated herein in its entirety by reference.

BACKGROUND

1. Field

A quantum dot-polymer micronized composite, a production method thereof, and an article and an electronic device including the same are disclosed.

2. Description of the Related Art

A luminous particle is applicable to various display devices as being dispersed in a polymer host matrix. For example, semiconductor nanocrystals (also referred to as quantum dots, QDs) are dispersed in a host matrix of a polymer or an inorganic material, to be used as a light conversion layer in a luminous diode. When a quantum dot is colloid-synthesized, the particle size may be uniformly controlled. When quantum dots have a size of less than or equal to about 10 nanometers (nm), the quantum confinement effects in which the bandgap is increased according to decreasing size of the quantum dots becomes significant, and thus the energy density is enhanced. Therefore, a quantum dot emits light in a visible light region with improved luminous efficiency and thus is used in light emitting diodes (LED) for various illumination devices and backlight units.

As quantum dots have a theoretical quantum efficiency of 100% and emit light having a high color purity (e.g., full width at half maximum (FWHM) of less than or equal to about 40 nm), they may enhance a luminous efficiency and improve a color reproducibility compared with an inorganic phosphor. Unlike the inorganic phosphor having a micro-size, however, the quantum dots have a nano-size and thus have a problem of a short life-span (e.g., vulnerability to an external factor such as moisture or oxygen).

However, complex processes and special equipment are needed for producing micronized quantum dot-polymer composites having desired sizes and uniformity. Accordingly, developing a technology for overcoming this problem is desired.

SUMMARY

An embodiment provides a quantum dot-polymer micronized composite having a desired size and desired uniformity.

Another embodiment provides an article including the quantum dot-polymer micronized composite.

Yet another embodiment provides a method of producing the quantum dot-polymer micronized composite.

In an embodiment, a quantum dot-polymer micronized composite includes:
a first polymer matrix;
a plurality of quantum dots dispersed in the first polymer matrix; and
an additive, wherein the additive includes at least one of a clay particle embedded in the first polymer matrix and a metal halide dispersed in the first polymer matrix, and wherein the composite has an average particle size of less than or equal to about 100 micrometers (μm).

The first polymer matrix may include a polyacrylate, a polymethacrylate, a polyacrylic acid, a polyacrylate salt, a polymethacrylic acid, a polymethacrylate salt, polyolefin, a polystyrene, a poly(alkylene-co-acrylic acid), a poly(alkylene-co-acrylate salt), a poly(alkylene-co-methacrylic acid), a poly(alkylene-co-methacrylate salt), a poly(styrene-co-acrylic acid), a poly(styrene-co-methacrylic acid), a poly(styrene-co-thiol-terminated ethylene), a thiol-ene polymer, a polyamide, a polyimide, a polyisocyanate, a polythiol, a polyester, or a combination thereof.

The first polymer matrix may include a polymer having a functional group capable of reacting with the quantum dot.

The functional group may be selected from —COOR (wherein, R is hydrogen, a monovalent organic functional group, or a monovalent to trivalent metal ion), a —RCOOR' group (wherein R is a substituted or unsubstituted C1 to C10 alkylene group and R' is hydrogen, a monovalent organic functional group, or a monovalent to trivalent metal ion), a substituted or unsubstituted C2 to C20 alkenyl group, a substituted or unsubstituted C2 to C20 alkynyl group, a halide moiety (—F, —Cl, —Br, or —I), a —ROR' group (wherein R is a substituted or unsubstituted C1 to C10 alkylene group and R' is hydrogen, a monovalent organic functional group, or a monovalent to trivalent metal ion), an acyl halide group (—RCOX, wherein R is a substituted or unsubstituted C1 to C10 alkylene group and X is F, Cl, Br, or I), —CONRR' (wherein R and R' are hydrogen, a monovalent organic functional group, or a monovalent to trivalent metal ion), an amine group (—NRR', wherein R and R' are independently hydrogen or a monovalent organic functional group), an imine group (—N(R')—, wherein R' is hydrogen, a monovalent organic functional group, or a monovalent to trivalent metal ion), a imide group (—C(=O)NC(=O)—), an isocyanate group (—N=C=O), an acrylate group (—OC(=O)—C(H)=CH$_2$), a methacrylate group (—OC(=O)—C(CH$_3$)=CH$_2$), a thiol group (—SH), a phosphine oxide group (—P(=O)R'R", wherein R' and R" are independently hydrogen, a monovalent organic functional group, or a monovalent to trivalent metal ion), —SO$_3$R' (wherein R' is hydrogen, a monovalent organic functional group, or a monovalent to trivalent metal ion), and a nitro group (—NO$_2$), or a combination thereof The quantum dot of the plurality of quantum dots may include a Group II-VI compound, a Group III-V compound, a Group IV-VI compound, a Group IV element or compound, a Group I-IV compound, a Group I-III-VI compound, a Group I-II-IV-IV compound, or a combination thereof.

The clay particle may have a planate surface, an average thickness of less than or equal to about 10 nm and a lateral size of about 50 nm to about 10 μm.

The clay particle may be modified with an organic compound having a heteroatom and a hydrocarbyl group linked to the heteroatom.

The organic compound may be selected from an amine, an ammonium salt, a phosphine, a phosphonium salt, an amine group-containing thiol, a mercapto group-containing silane, and a combination thereof.

The organic compound may include an amine compound having at least one substituted or unsubstituted C6 to C20 hydrocarbyl linked to a nitrogen atom, a quaternary ammonium salt compound having at least one substituted or unsubstituted C6 to C20 hydrocarbyl linked to a nitrogen atom, a phosphine compound having at least one substituted or unsubstituted C6 to C20 hydrocarbyl linked to a phosphorus atom, a phosphonium salt compound having at least one substituted or unsubstituted C6 to C20 hydrocarbyl linked to a phosphorus atom, C6 to C20 mercaptan having an amine group (H$_2$N—), a alkoxysilane having a mercaptoalkyl group, or a combination thereof.

The clay particle may include smectite, mica, vermiculite, montmorillonite, iron-containing montmorillonite, beidellite, saponite, hectorite, stibensite, nontronite, an anionic clay, zirconium phosphate, kaolinite, atapulgite, illite, halloysite, diatomaceous earth, fuller's earth, calcined aluminium silicate, hydrated aluminium silicate, magnesium aluminium silicate, sodium silicate, magnesium silicate, or a combination thereof.

The metal halide may include an alkaline metal, an alkaline-earth metal, or a transition metal and may include a fluoride, a chloride, a bromide, or an iodide.

An amount of the additive may be about 1 part by weight to about 50 parts by weight per 100 parts by weight of the first polymer matrix.

The additive may include the clay particle, and in the quantum dot-polymer micronized composite, planate surfaces of at least two the clay particles may face each other, and quantum dots dispersed in the first polymer matrix may be disposed between the at least two clay particles.

The additive may include the metal halide, and the composite may include a metal ion, a halogen ion, or a combination thereof of the metal halide.

The quantum dot-polymer micronized composite may further include a polymer-overcoating disposed on at least one part of the surface thereof.

The quantum dot-polymer micronized composite may further include a hydrocarbyl chloride.

In another embodiment, an article includes
a second polymer matrix; and
the quantum dot-polymer micronized composite dispersed in the second polymer matrix.

The second polymer matrix may include a silicone resin; an epoxy resin; poly(meth)acrylate; an organic/inorganic hybrid polymer; polycarbonate; a polystyrene; a polyolefin; a thiol-ene polymer; or a combination thereof.

The article may be in a form of a film.

Another embodiment provides a method of producing the quantum dot-polymer micronized composite. The method includes:
dissolving a polymer having a functional group capable of reacting with quantum dots in a first organic solvent under an inert atmosphere to prepare a polymer solution;
adding a plurality of quantum dot and at least one additive selected from a clay particle and a metal halide to the polymer solution to obtain a mixture;
heating the mixture to perform a reaction between the plurality of quantum dots and the polymer;
forming a precipitate from the mixture; and
separating the obtained precipitate.

The polymer may include a polyacrylate, a polyacrylic acid, a polyacrylate salt, a polymethacrylic acid, a polymethacrylate salt, a polyolefin, a polystyrene, a poly(alkylene-co-acrylic acid), a poly(alkylene-co-acrylate salt), poly(alkylene-co-methacrylic acid), a poly(alkylene-co-methacrylate salt), a poly(styrene-co-acrylic acid), a poly(styrene-co-methacrylic acid), a poly(styrene-co-thiol-terminated ethylene), a thiol-ene polymer, a polyamide, a polyimide, a polyisocyanate, a polythiol, a polyester, or a combination thereof, in its backbone, and the functional group may include —COOR (wherein, R is hydrogen, a monovalent organic functional group, or a monovalent to trivalent metal ion), a —RCOOR' group (wherein R is a substituted or unsubstituted C1 to C10 alkylene group and R' is hydrogen, a monovalent organic functional group, or a monovalent to trivalent metal ion), a substituted or unsubstituted C2 to C20 alkenyl group, a substituted or unsubstituted C2 to C20 alkynyl group, a halide moiety (—F, —Cl, —Br, or —I), a —ROR' group (wherein R is a substituted or unsubstituted C1 to C10 alkylene group and R' is hydrogen, a monovalent organic functional group, or a monovalent to trivalent metal ion), an acyl halide group (—RCOX, wherein R is a substituted or unsubstituted C1 to C10 alkylene group and X is F, Cl, Br, or I), —CONRR' (wherein R and R' are hydrogen, a monovalent organic functional group, or a monovalent to trivalent metal ion), an amine group (—NRR', wherein R and R' are independently hydrogen or a monovalent organic functional group), an imine group (—N(R')—, wherein R' is hydrogen, a monovalent organic functional group, or a monovalent to trivalent metal ion), a imide group (—C(=O)NC(=O)—), an isocyanate group (—N=C=O), an acrylate group (—OC(=O)—C(H)=CH$_2$), a methacrylate group (—OC(=O)—C(CH$_3$)=CH$_2$), a thiol group (—SH), a phosphine oxide group (—P(=O)R'R", wherein R' and R" are independently hydrogen, a monovalent organic functional group, or a monovalent to trivalent metal ion), —SO$_3$R' (wherein R' is hydrogen, a monovalent organic functional group, or a monovalent to trivalent metal ion), a nitro group (—NO$_2$), or a combination thereof.

The adding of the plurality of quantum dots and the additive to the polymer solution may include simultaneously or sequentially adding to the polymer solution a quantum dot dispersion (which is prepared by dispersing the quantum dots in a second organic solvent miscible with the first organic solvent) and an additive dispersion (which is prepared by dispersing the additive in a third organic solvent miscible with the first organic solvent).

The additive may be dissolved in an organic solvent miscible with the first organic solvent and then be added.

The forming of the precipitate may comprise cooling the mixture after completion of the reaction between the plurality of quantum dots and the polymer or adding a precipitation-inducing substance to the mixture.

The method may further include pulverizing the separated precipitate.

The precipitation-inducing substance may include organic zinc, organic indium, organic gallium, a zinc salt, an indium salt, a gallium salt, or a combination thereof.

The separated precipitate may be pulverized at a temperature of greater than about 0° C. and less than or equal to 25° C. The pulverization of the separated precipitate may be carried out in the presence of an inert solvent, for example hexane.

In another embodiment, an electronic device includes the quantum dot-polymer micronized composite.

The electronic device may be a display, a luminous device, a memory device, a laser device, or a solar cell.

The quantum dot polymer micronized composite may be prepared by pulverization at room temperature without involving a special process such as a low temperature pulverization to have a reduced size as desired with improved uniformity in sizes.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and/or other aspects will become apparent and more readily appreciated from the following description of the embodiments, taken in conjunction with the accompanying drawings in which.

DETAILED DESCRIPTION

Figure 1:
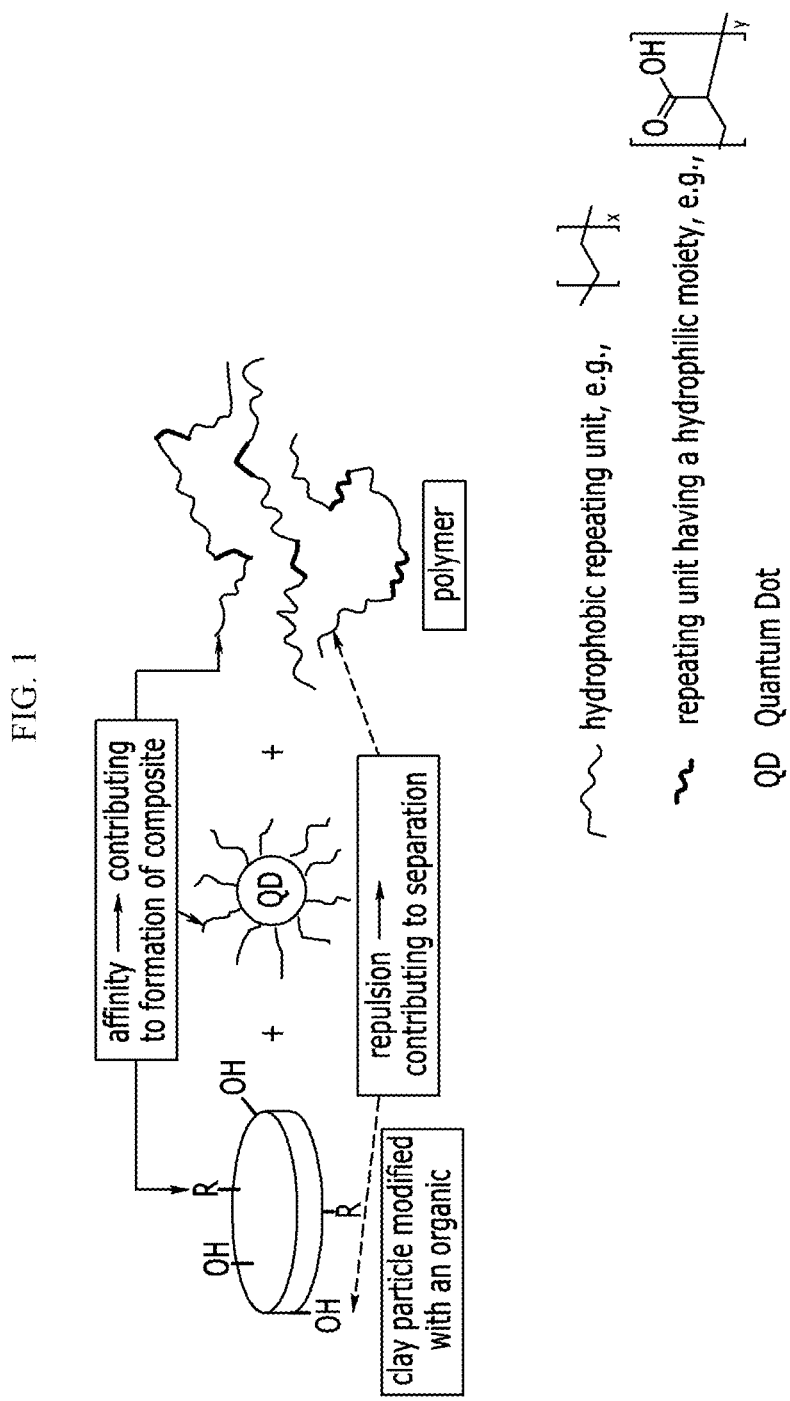
FIG. 1 is a schematic view showing a reaction according to an embodiment of the disclosure.

Advantages and characteristics of this disclosure, and a method for achieving the same, will become evident referring to the following exemplary embodiments together with the drawings attached hereto. The embodiments, may, however, be embodied in many different forms and should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an."

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to a group or compound wherein at least one of the hydrogen atoms thereof is substituted with a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C3 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, the term "hydrocarbyl group" refers to a monovalent group (e.g., alkyl group, alkenyl group, alkynyl group, or aryl group) formed by a removal of a hydrogen atom from an aliphatic or aromatic hydrocarbon such as alkane, alkene, alkyne, or arene. In the hydrocarbyl group, at least one methylene (—CH$_2$—) moiety may be replaced with an oxide (—O—) moiety.

As used herein, the term "monovalent to trivalent metal ion" refers to a cation of an alkali metal or an alkaline-earth metal, or a cation of a transition metal.

As used herein, the term "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C3 to C30 cycloalkynyl group, or a C2 to C30 heterocycloalkyl group.

As used herein, when a definition is not otherwise provided, the term "hetero" refers to inclusion of 1 to 3 heteroatoms selected from N, O, S, Si, and P.

As used herein, the term "alkylene group" may refer to a straight or branched saturated aliphatic hydrocarbon group having a valence of at least two, optionally substituted with one or more substituents. The term "arylene group" may refer to a functional group having a valence of at least two obtained by removal of at least two hydrogens in an aromatic ring, optionally substituted with one or more substituents.

As used herein, a "polyacrylate" is a polymer of a C1 to C6 alkyl acrylate. As used herein a polyalkylene can be homopolymer or a copolymer formed from C2 to C8 alkene, preferably a C2 to C4 alkene. Further as used herein, a "thiol-ene polymer" is a polymer containing units having thiol groups and units having alkenyl groups.

As used herein, the term "clay particle" may include aluminum phyllosilicates, for example, hydrous aluminum phyllosilicates, and the aluminum phyllosilicate may include iron, magnesium, an alkaline metal, an alkaline-earth metal, a transition metal, or a combination thereof. The clay particle may be a natural clay mineral or synthetic clay. As used herein, when a definition is not otherwise provided, the term "quaternary ammonium salt" refers to a salt including a cation represented by NR$_4^+$ (wherein, each R is independently a hydrogen atom, a C1 to C30 alkyl group, or a C6 to C30 aryl group, and at least two of them may be linked to each other, or they are not linked to each other) and an anion (e.g., halide, sulfate, phosphate, nitrate, or the like).

Further as used herein, when a definition is not otherwise provided, an alkyl group is a C1 to C20 alkyl, or a C1 to C12 alkyl, or a C1 to C6 alkyl.

As used herein, the term "Group" refers to a group of Periodic Table.

As used herein, "Group I" refers to Group IA and Group IB, and examples may include Li, Na, K, Ru, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group V" refers to Group VA, and examples may include N, P, As, Sb, and Bi, but are not limited thereto.

As used herein, "Group VI" refers to Group VIA, and examples may include S, Se, and Te, but are not limited thereto.

In an embodiment, a quantum dot-polymer micronized composite includes
a first polymer matrix;
a plurality of quantum dots dispersed in the first polymer matrix; and an additive. The additive may include at least one selected from a clay particle and a metal halide. The clay particle may be embedded in the first polymer matrix. The metal halide may be dispersed in the polymer matrix. The metal halide may be present in a metal ion and a halide ion in the polymer matrix.

The first polymer matrix may include clay particle or inorganic salt filled therein.

The first polymer matrix may include a copolymer (e.g., a random copolymer) including a hydrophobic repeating unit such as ethylene moiety and/or styrene moiety and a repeating unit including a hydrophilic moiety such as a carboxyl group and/or hydroxy group. The clay particle may be an organo-modified clay particle. The metal halide may be a metal chloride. The metal chloride may be zinc chloride. The quantum dot may include an organic ligand bound to the surface. The organic ligand may have a hydrophobic moiety.

The quantum dot emits light having a narrow full width at half maximum (FWHM) with a desirable luminous efficiency and may be applied to improve the color reproducibility of a display device. Luminous properties (luminous wavelength and efficiency) of the quantum dot may be largely changed/deteriorated by exposure to an external environment such as oxygen, moisture, and the like, and aggregation among quantum dots. Accordingly, in order to be applied to a device, the quantum dot may form a composite with a polymer. The quantum dot-polymer composite may undergo a pulverization process to increase the uniformity of luminous properties in the device. However, high energy applied in the pulverizing process may result in a decreased luminous efficiency of the quantum dot, while a conventional pulverization process (e.g., a manual milling, a ball milling, etc.) may not provide a quantum dot polymer micronized composite having a desired size and uniformity. For example, cryogenic milling has been used to produce a quantum dot polymer micronized composite. The cryogenic milling is an expensive process provided by liquid nitrogen and performed at a low temperature. In addition, impact energy applied to a composite during the pulverizing may cause deterioration of the luminous properties of the quantum dots.

In an embodiment, a quantum dot polymer composite that further includes an organo-modified clay particle and/or metal halide may be pulverized under a mild condition (or even manually milled) so that it may be prepared as a micronized composite (particle) having a desired size and uniformity. In the quantum dot-polymer composite including the quantum dots dispersed in a polymer matrix, the polymer chains tend to tangle with one another and thus the pulverization cannot be carried out under a mild condition. However, according to the embodiments, the quantum dot-polymer composite includes the foregoing additive such as the clay particle and/or metal halide and thereby may be relatively easily pulverized.

Without being bound by any particular theory, the clay particle and/or the metal halide in the quantum dot-polymer composite may alleviate the cohesion (or entanglement) between the components of the composite. For example, referring to FIG. 1 that illustrates a composite including the clay particle, the organo-modified clay particle may be a small plate-shaped particle having a nano-meter scale thickness and its surface may include a hydrophobic moiety introduced through organic modification while having a plurality of hydrophilic moieties (e.g., a hydroxy group). The organic moiety of the clay particle may provide sufficient affinity with an organic ligand on the surface of the quantum dot and hydrophobic chains of the polymer to form a composite. At the same time, the organo-modified clay particles contained in the quantum dot-polymer composite include a hydrophilic moiety, providing a repulsive force with respect to the hydrophobic polymer chains, which may interrupt the cohesion among the components of the composite or weaken a bonding strength therebetween. In the clay particle, the silicate layers form a layered structure with a weak binding force and may be separated into a thinner plate-shaped particle with a weak force. In addition, the metal halide dispersed in the quantum dot-polymer composite may obstruct cohesion among the composite components and reduce a bonding force therebetween.

Accordingly, the composite including the foregoing additives may be pulverized under a mild condition (e.g., with a low impact energy) and may be prepared as a micronized composite particle having a sufficiently-reduced size without an additional expensive process such as a cryogenic milling.

The first polymer matrix may include a polyacrylate, a polymethacrylate, a polyacrylic acid, a polyacrylate salt, a polymethacrylic acid, a polymethacrylate salt, a polyolefin, a polystyrene, a poly(alkylene-co-acrylic acid), a poly(alkylene-co-acrylate salt), a poly(alkylene-co-methacrylic acid), a poly(alkylene-co-methacrylate salt), a poly(styrene-co-acrylic acid), a poly(styrene-co-methacrylic acid), a poly(styrene-co-thiol-terminated ethylene), a thiol-ene polymer, a polyamide, a polyimide, a polyisocyanate, a polythiol, a polyester, or a combination thereof.

The first polymer matrix may include a polymer having a functional group capable of reacting with the quantum dot (e.g., the quantum dot surface). The functional group may be directly bound to the quantum dot. The functional group may include —COOR (wherein, R is a hydrogen atom, a monovalent organic functional group, or a monovalent to trivalent metal ion), a —RCOOR' group (wherein R is a substituted or unsubstituted C1 to C10 alkylene group and R' is a hydrogen atom, a monovalent organic functional group, or a monovalent to trivalent metal ion), a substituted or unsubstituted C2 to C20 alkenyl group, a substituted or unsubstituted C2 to C20 alkynyl group, a halide moiety (—F, —Cl, —Br, or —I), a —ROR' group (wherein R is a substituted or unsubstituted C1 to C10 alkylene group and R' is a hydrogen atom, a monovalent organic functional group, or a monovalent to trivalent metal ion), an acyl halide group (—RCOX, wherein R is a substituted or unsubstituted C1 to C10 alkylene group and X is F, Cl, Br, or I), —CONRR' (wherein R and R' are each independently a hydrogen atom, a monovalent organic functional group, or a monovalent to trivalent metal ion), an amine group (NRR', wherein R and R' are each independently a hydrogen atom or a monovalent organic functional group), an imine group (—N(R')—, wherein R' is a hydrogen atom, a monovalent organic functional group, or a monovalent to trivalent metal ion), a imide group (—C(=O)NC(=O)—), an isocyanate group (—N=C=O), an acrylate group (—OC(=O)—C(H)=CH$_2$), a methacrylate group (—OC(=O)—C(CH$_3$)=CH$_2$), a thiol group (—SH), a phosphine oxide group (—P(=O)R'R", wherein R' and R" are each independently a hydrogen atom, a monovalent organic functional group, or a monovalent to trivalent metal ion), —SO$_3$R' (wherein R' is a hydrogen atom, a monovalent organic functional group, or a monovalent to trivalent metal ion), a nitro group (—NO$_2$), or a combination thereof.

For example, the first polymer matrix may be a copolymer including an alkylene or styrene repeating unit and a repeating unit including the functional group. For example, the first polymer matrix may include a block copolymer and/or a random copolymer each including an alkylene repeating unit and a repeating unit derived from (meth)acrylic acid or a salt derived therefrom, for example, a poly(alkylene-co-acrylic acid), a poly(alkylene-co-acrylate salt), a poly(alkylene-co-methacrylic acid), and a poly(alkylene-co-methacrylate salt). For example, the copolymer may be a branched, random ethylene (meth)acrylic acid copolymer produced by a high-pressure polymerization of ethylene and (meth)acrylic acid in the presence of a free radical initiator. In the block copolymer and/or the random copolymer, a structural unit derived from acrylic acid, methacrylic acid, or a salt thereof may be present in an amount of about 4 wt % to about 20 wt % based on a total weight of the copolymer.

The aforementioned copolymer such as the polyacrylate salt, the polymethacrylate salt, the poly(alkylene-co-acrylate salt), and the poly(alkylene-co-methacrylate salt) may include a monovalent metal that may form an ionic bond with a carboxyl group of the polyacrylic acid, the polymethacrylic acid, the poly(alkylene-co-acrylic acid), and the poly(alkylene-co-methacrylic acid), or a divalent or a polyvalent metal that forms a coordinate bond with the carboxyl group thereof. Examples of the monovalent metal may include Na, K, Rb, and the like, and examples of the divalent or polyvalent metal may include Mg, Ca, Sc, Ti, V, Cr, Mn, Fe, Co, Ni, Cu, Zn, Ga, Sr, Y, Zr, Nb, Mo, Cd, In, Ba, Au, Hg, Tl, and the like.

A molecular weight of the polymer of the first polymer matrix is not particularly limited and may be selected appropriately. For example, a weight average molecular weight of the polymer may be greater than or equal to about 500, for example, greater than or equal to about 1000, but is not limited thereto. A weight average molecular weight of the polymer may be less than or equal to about 1000000, for example, less than or equal to about 500000, less than or equal to about 300000, less than or equal to about 100000, less than or equal to about 50000, less than or equal to about 10000, less than or equal to about 9000, less than or equal to about 8000, less than or equal to about 7000, or less than or equal to about 6000, but is not limited thereto. The average molecular weight may be determined by a gel permeation chromatography (GPC) analysis or a gel permeation chromatography and size exclusion chromatography (GPC-SEC) analysis. The GPC analysis and the GPC-SEC analysis may be carried out using an organic solvent (e.g., THF or DMF) as an eluent and polystyrene as a standard sample.

The plurality of quantum dots dispersed in the first polymer matrix may include a Group II-VI compound, a Group III-V compound, a Group IV-VI compound, a Group IV element or compound, a Group I-IV compound, a Group compound, a Group I-II-IV-IV compound, or a combination thereof.

The Group II-VI compound may be selected from a binary element compound selected from CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof.

The Group IV element or compound may include a single-element compound selected from Si, Ge, and a mixture thereof; and a binary element compound selected from SiC, SiGe, and a mixture thereof.

The Group compound may include $CuInSe_2$, $CuInS_2$, CuInGaSe, and CuInGaS, but is not limited thereto. The Group I-II-IV-IV compound may include CuZnSnSe, and CuZnSnS, but is not limited thereto.

The binary element compound, the ternary element compound, or the quaternary element compound respectively exist in a uniform concentration in the quantum dot particle or different concentrations in the same particle. In addition, the quantum dot may have a core-shell structure wherein a quantum dot surrounds another (different) quantum dot. The core and shell may have an interface, and an element of at least one of the core or the shell in the interface may have a concentration gradient wherein the concentration of the element(s) of the shell decreases toward the core. In addition, the quantum dot may have one core of a quantum dot and multiple shells surrounding the core. The core and multi-shell structure has at least two shells wherein each shell may be a single composition, an alloy, or one having a concentration gradient.

In the quantum dot particle, the materials of the shell may have a larger energy bandgap than that of the core, and thereby the quantum dot may exhibit a quantum confinement effect more effectively. In case of a multi-shell type of quantum dot particle, the energy bandgap of the material of an outer shell may be higher than that of the material of an inner shell (a shell that is closer to the core).

The quantum dot may have quantum efficiency of greater than or equal to about 10%, greater than or equal to about 30%, for example, greater than or equal to about 50%, greater than or equal to about 60%, greater than or equal to about 70%, or greater than or equal to about 90%.

The quantum dot may have a narrow full width at half maximum (FWHM) to provide an enhanced color purity or color reproducibility in a display. The quantum dot may have a FWHM of less than or equal to about 45 nanometers (nm), for example less than or equal to about 40 nm, or less than or equal to about 30 nm. Within such ranges, a device including the quantum dot may have enhanced color purity or improved color reproducibility.

The quantum dot may have a particle size of about 1 nm to about 100 nm. For example, the quantum dot may have a particle size of about 1 nm to about 20 nm, for example, about 2 nm (or about 3 nm) to about 15 nm.

The shape of the quantum dot is not particularly limited. For example, the quantum dot may be a nano-size particle or a nanosheet. The quantum dot may have a spherical, pyramidal, polygonal, multipod, or cubic shape, but is not limited thereto.

The quantum dot may be commercially available or may be synthesized according to any method. For example, several nano-sized quantum dots may be synthesized according to a wet chemical process. In the wet chemical process, precursors react in an organic solvent to grow nanocrystal particles, and the organic solvent or a ligand compound may coordinate on the surface of the semiconductor nanocrystal, controlling the growth of the nanocrystal. Examples of the organic solvent and ligand compound are known. The organic solvent coordinated on the surface of the quantum dot may affect stability of a device, and thus excess organic materials that are not coordinated on the surface of the quantum dot may be removed by pouring it in excessive non-solvent, and centrifuging the resulting mixture. Examples of the non-solvent may be acetone, ethanol, methanol, and the like, but are not limited thereto. After the removal of extra organic materials, the amount of the organic materials coordinated on the surface of the quantum dot may be less than or equal to about 50% by weight, for example, less than or equal to about 30 wt %, less than or equal to about 20 wt % or less than or equal to about 10 wt %. The organic material may include a ligand compound, an organic solvent, or a combination thereof.

The quantum dot may have an organic ligand having a hydrophobic moiety bound to its surface. In an embodiment, the organic ligand having the hydrophobic moiety may be RCOOH, RNH$_2$, R$_2$NH, R$_3$N, RSH, R$_3$PO, R$_3$P, ROH, RCOOR', RPO (OH)$_2$, R$_2$POOH (wherein, R and R' are independently a C5 to C24 alkyl group, a C5 to C24 alkenyl group, or a C6 to C20 aryl group), a polymer organic ligand, or a combination thereof.

Examples of the organic ligand compound bound to the quantum dot may be a thiol compound such as methane thiol, ethane thiol, propane thiol, butane thiol, pentane thiol, hexane thiol, octane thiol, dodecane thiol, hexadecane thiol, octadecane thiol, and benzyl thiol; amines such as methylamine, ethylamine, propylamine, butylamine, pentyl amine, hexyl amine, octyl amine, nonylamine, decylamine, dodecyl amine, hexadecyl amine, octadecyl amine, dimethyl amine, diethyl amine, dipropyl amine, tributylamine, and trioctylamine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, and benzoic acid; phosphine compounds such as methyl phosphine, ethyl phosphine, propyl phosphine, butyl phosphine, pentyl phosphine, octylphosphine, dioctyl phosphine, tributylphosphine, and trioctylphosphine; phosphine oxide compounds such as methyl phosphine oxide, ethyl phosphine oxide, propyl phosphine oxide, butyl phosphine oxide, pentyl phosphine oxide, tributylphosphine oxide, octylphosphine oxide, dioctyl phosphine oxide, and trioctylphosphine oxide; a C5 to C20 alkyl or aryl phosphonic acid derivative such as diphenyl phosphine or triphenyl phosphine, or an oxide compound thereof; hexylphosphinic acid, octylphosphinic acid, dodecanephosphinic acid, tetradecanephosphinic acid, hexadecanephosphinic acid, and octadecanephosphinic acid; and the like, but are not limited thereto. The quantum dot may include one or more hydrophobic organic ligands.

A content of the quantum dot including the organic ligand may be greater than or equal to about 1 wt %, for example, greater than or equal to about 5 wt %, or greater than or equal to about 10 wt % based on the total weight of the composite. The content of the quantum dot including the organic ligand may be less than or equal to about 60 wt %, for example, less than or equal to about 45 wt % or less than or equal to about 40 wt % based on the total weight of the composite.

The clay particle may be a sheet having a nanometer-sized thickness. For example, the clay particle may have a stacking structure (layered structure) including at least two sheets. An average thickness of the clay particle may be less than or equal to about 10 nm, for example, less than or equal to about 9 nm, less than or equal to about 8 nm, less than or equal to about 7 nm, less than or equal to about 6 nm, less than or equal to about 5 nm, less than or equal to about 4 nm, or less than or equal to about 3 nm. The average thickness of the clay particle may be greater than or equal to about 1 nm. A lateral size of the clay particle may be greater than or equal to about 50 nm, for example, greater than or equal to about 100 nm, or greater than or equal to about 1 µm. The lateral size of the clay particle may be less than or equal to about 10 µm, or less than or equal to about 5 µm, less than or equal to about 4 µm, less than or equal to about 3 µm, less than or equal to about 2 µm, or less than or equal to about 1 µm.

The clay particle may include smectite clay, mica clay, vermiculite clay, montmorillonite clay, iron-containing montmorillonite clay, beidellite clay, saponite clay, hectorite clay, stibensite clay, nontronite clay, anionic clay, zirconium phosphate, kaolinite, atapulgite, illite, halloysite, diatomaceous earth, fuller's earth, calcined aluminium silicate, hydrated aluminium silicate, magnesium aluminum silicate, sodium silicate, magnesium silicate, or a combination thereof.

The clay particle may be an organo-modified clay particle. In an embodiment, the organo-modified clay particle may be modified with an organic compound having a hydrocarbyl group linked to a heteroatom. The organic compound may be selected from amine, an ammonium salt, a phosphine, a phosphonium salt, an amine group-containing thiol, a mercapto group-containing silane, or a combination thereof. Such a clay particle may be obtained by exchanging cations between layers of the particle with a cation of the compound (e.g., ammonium cation, phosphonium cation, etc.). Such a clay particle may be obtained by attaching the compound to the surface of the particle. The organo-modified clay particle may be commercially available or may be produced by a known method. For example, the organo-modified clay particle may be obtained by dispersing clay particles to be modified in a small amount of water, and adding the organic compound followed by stirring the resultant for a predetermined time and filtering it.

The organic compound may include an amine compound having at least one substituted or unsubstituted C6 to C20 hydrocarbyl linked to a nitrogen atom, a quaternary organic ammonium salt compound having at least one substituted or unsubstituted C6 to C20 hydrocarbyl linked to a nitrogen atom, a phosphine compound having at least one substituted or unsubstituted C6 to C20 hydrocarbyl linked to a phosphorus atom, a phosphonium salt compound having at least one substituted or unsubstituted C6 to C20 hydrocarbyl linked to a phosphorus atom, a C6 or more mercaptan compound having an amine group (H$_2$N—), a alkoxysilane compound having a mercaptoalkyl group, or a combination thereof.

For example, the organic compound may include a n-hexyltrimethylammonium salt (e.g., n-hexyltrimethylammonium bromide, n-hexyltrimethylammonium chloride, etc.), a dioctadecyldimethylammonium salt, a methyltrioctylammonium salt, a hexyltriphenylphosphonium salt, a tributylmethylphosphonium salt, a triethylpentylphosphonium salt, 8-amino-1-octanethiol, triethyloctyl phosphonium, tetraphenyl phosphonium, or a combination thereof.

A content of the clay particle may be greater than or equal to about 1 part by weight, for example, greater than or equal to about 2 parts by weight, greater than or equal to about 3 parts by weight, greater than or equal to about 4 parts by weight, greater than or equal to about 5 parts by weight, greater than or equal to about 6 parts by weight, greater than or equal to about 7 parts by weight, greater than or equal to about 8 parts by weight, greater than or equal to about 9 parts by weight per 100 parts by weight of the first polymer matrix. The content of the clay particle may be less than or equal to about 50 parts by weight, for example, less than or equal to about 45 parts by weight, less than or equal to about 40 parts by weight, less than or equal to about 35 parts by weight, less than or equal to about 30 parts by weight, less than or equal to about 25 parts by weight, less than or equal to about 24 parts by weight, less than or equal to about 23 parts by weight, less than or equal to about 22 parts by weight or less than or equal to about 21 parts by weight per 100 parts by weight of the first polymer matrix. In an embodiment, the content of the clay particle may be about 10 parts by weight to about 20 parts by weight.

Figure 2:
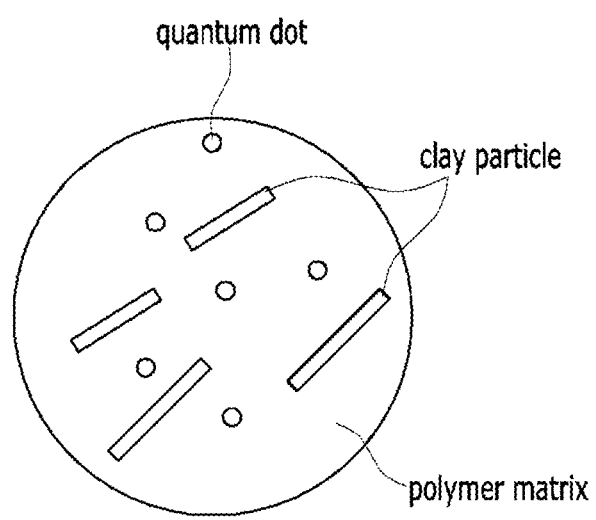
FIG. 2 is a schematic view of a quantum dot-polymer micronized composite according to an embodiment of the disclosure.

As illustrated in FIG. 2, when the quantum dot-polymer micronized composite includes the clay particle, planate surfaces of at least two the clay particles may face each other, and quantum dots dispersed in the first polymer matrix may be disposed between the at least two clay particles.

The metal halide may include an alkali metal such as lithium, sodium, and potassium, an alkaline-earth metal such as magnesium and calcium, or a transition metal such as zinc. The metal halide may include a fluoride, a chloride, a bromide, or an iodide anion. The metal halide may include zinc chloride.

In the composite, the metal halide may be present as an ionic compound, or as a dissociated metal ion and halogen ion.

A content of the clay particle and/or metal halide may be greater than or equal to about 1 part by weight, for example, greater than or equal to about 2 parts by weight, greater than or equal to about 3 parts by weight, greater than or equal to about 4 parts by weight, greater than or equal to about 5 parts by weight, greater than or equal to about 6 parts by weight, greater than or equal to about 7 parts by weight, greater than or equal to about 8 parts by weight, greater than or equal to about 9 parts by weight, or greater than or equal to about 10 parts by weight per 100 parts by weight of the first polymer matrix. The content of the clay particle and/or metal halide may be less than or equal to about 50 parts by weight, for example, less than or equal to about 49 parts by weight, less than or equal to about 45 parts by weight, less than or equal to about 40 parts by weight, less than or equal to about 35 parts by weight, less than or equal to about 34 parts by weight, less than or equal to about 33 parts by weight, less than or equal to about 32 parts by weight, less than or equal to about 31 parts by weight, or less than or equal to about 30 parts by weight per 100 parts by weight of the first polymer matrix.

As described above, an additive including the clay particle and/or metal halide may prevent agglomeration of polymers when the composite is pulverized to have a predetermined size and thus a small force during the pulverization may be used. In addition, in an embodiment, the additive may apply desirable luminous efficiency to the obtained micronized composite.

Figure 3:
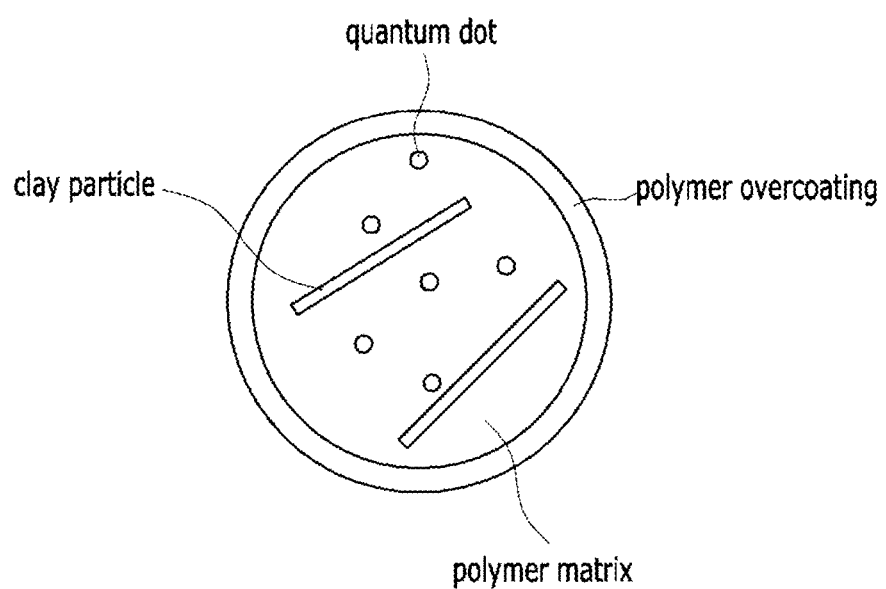
FIG. 3 is a schematic view of a quantum dot-polymer micronized composite according to another embodiment of the disclosure.

The quantum dot-polymer micronized composite may further include a polymer overcoating disposed on at least a part of the surface thereof, as illustrated in FIG. 3. The polymer overcoating may be, for example, an encapsulation polymer including one or more the quantum dot-polymer micronized composite. The polymer overcoating may be a material (e.g., a silicon resin, an epoxy resin, etc.) used as an encapsulant (i.e., second polymer matrix) in a subsequent device manufacturing process, or a polymer having affinity therefor. As non-limiting examples, the second polymer may be a silicone resin; an epoxy resin; a poly(meth)acrylate; an organic/inorganic hybrid polymer; a polycarbonate; a polystyrene; a polyolefin; a copolymer of a first monomer having at least two thiol (—SH) groups and a second monomer having at least two carbon-carbon unsaturated bonds (hereinafter, a thiol-ene copolymer); or a combination thereof. In case of using the polymer overcoating, agglomeration of composite particulates may be reduced when the composite particulate is dispersed in the second polymer matrix.

The silicone resin may be any suitable silicone resin that is used for an encapsulant, and may be commercially available. As non-limiting examples, the silicone resin may be a Dow Corning® OE series optical encapsulant. The epoxy resin may be any epoxy resin that is used for an encapsulant, and may be commercially available. The poly(meth)acrylate may be poly(methylmethacrylate) (PMMA), poly(laurylmethacrylate) (PLMA), and the like.

The organic/inorganic hybrid polymer may include any suitable organic/inorganic hybrid polymer as an encapsulant. As non-limiting examples, the organic/inorganic hybrid polymer may include a siloxane bond (—Si—O—Si—)-containing a first moiety, a siloxane bond-containing a second moiety including at least one organic functional group, and a siloxane bond-containing a third moiety having a structure where at least one reactive functional group is cross-linked. The organic/inorganic hybrid polymer may further include a fourth moiety including a —O-M-O— bond (wherein M is Al, Sn, Ti, Zr, Ge, B, or a combination thereof). The organic/inorganic hybrid polymer is disclosed in Korean Patent Publication No. 10-2012-0137136, which is incorporated herein by reference in its entirety.

The thiol-ene copolymer is disclosed in US 2015-0218444 A1 in detail, which is incorporated herein by reference in its entirety.

The epoxy resin, the poly(meth)acrylate, the polycarbonate, the polystyrene, and the polyolefin may be commercially available or may be produced by a suitable method.

The quantum dot-polymer micronized composite may further include a hydrocarbyl chloride.

The quantum dot-polymer micronized composite may be produced by a method, which includes:

dissolving a polymer having a functional group capable of reacting with quantum dots in a first organic solvent under an inert atmosphere to prepare a (e.g., homogeneous) polymer solution; adding a plurality of quantum dots and an additive (i.e., a plurality of clay particles and/or a metal halide) to the polymer solution to prepare a (e.g., homogeneous) mixture;

heating the mixture to perform a reaction between the quantum dots and the polymer;

forming a precipitate from the mixture; and separating the formed precipitate.

The forming the precipitate may include adding a precipitation-inducing compound to the mixture to form a precipitate or cooling the mixture to form a precipitate. Any suitable precipitation-inducing compound may be used.

The method may further include pulverizing the separated precipitate.

The polymer having the functional group capable of reacting with the quantum dot may include a polymer that constitutes a first polymer matrix, and its types and the types of the functional group are the same as set forth above. The quantum dot, the clay particle, and the metal halide are the same as described above.

The inert atmosphere may be a nitrogen atmosphere, an argon atmosphere, or a combination thereof.

The first organic solvent for dissolving the polymer may be selected considering the types of the polymer and the miscibility with a solvent of a quantum dot/clay particle dispersion or a quantum dot/inorganic salt dispersion, which is described later. For example, the first organic solvent for dissolving the polymer may include a C6 to C20 aromatic hydrocarbon such as toluene and xylene, or a combination thereof, but is not limited thereto. The polymer solution may be heated if desired. During the heating, a suitable temperature may be determined depending on the types of the polymer and the solvents, but is not particularly limited.

The clay particle and the metal halide may be adopted with the same purpose of preventing agglomeration of the polymers, and some of the details of the clay particle may be applied to the metal halide.

The adding of the quantum dots and the additive (e.g. clay and/or metal halide) to the polymer solution may include adding simultaneously or sequentially to the polymer solution a quantum dot dispersion (which is prepared by dispersing the quantum dots in a second organic solvent miscible with the first organic solvent) and an additive-containing solution (e.g., a clay dispersion prepared by dispersing the clay particles in a third organic solvent miscible with the first organic solvent or a solution prepared by dissolving a metal halide in a third organic solvent).

The second and third organic solvent for the quantum dot dispersion and the additive-containing solution may be the same or different, and selected considering dispersibility/miscibility of the quantum dots or the additive (clay particle and/or metal halide) and the miscibility of the polymer solution with an organic solvent. For example, the second and third organic solvent for the quantum dot dispersion and the additive-containing solution may be a C6 to C20 aromatic hydrocarbon such as toluene and xylene, an alcohol based solvent (e.g., a C1 to C10 alcohol), or a combination thereof, but is not limited thereto. A mixing ratio of the polymer solution, quantum dot dispersion, and the additive-containing solution is not particularly limited, and may be appropriately selected considering desirable compositions of the final micronized composites. An amount of the second and third organic solvent is not particularly limited and may appropriately be selected.

The mixture of the polymer solution, the quantum dot dispersion, and the additive-containing solution is heated to react the quantum dot with the polymer. The heating is, for example, performed at about 80° C. to about 150° C., for example, at about 100° C. to about 120° C. but is not limited thereto. The reaction is performed for greater than or equal to about 30 minutes and less than or equal to about 2 hours without a particular limit.

The method may further include addition of a hydrocarbyl chloride to the mixture or the polymer solution in any step before cooling down the mixture. The hydrocarbyl chloride may be used by dissolving it in another organic solvent (e.g., alcohols, ketones, and the like) that is miscible with the first organic solvent.

A precipitation-inducing compound may be further added to the mixture before the completion of the reaction between the quantum dots and the polymer and cooling the mixture. The precipitation-inducing compound may include an organic zinc compound such as dialkyl zinc having a C1 to C10 alkyl group, a zinc salt such as zinc acetate, or a combination thereof.

The separated precipitate may be pulverized at a temperature of greater than about 0° C. and less than or equal to about 25° C. The pulverization of the separated precipitate may be performed in the presence of an organic solvent (e.g., an inert organic solvent such as hexane). The pulverization of the separated precipitate may be performed using any suitable method (e.g., blending, pulverizing, milling, jet milling, even hand milling, or the like) without a particular limit.

This produced quantum dot-polymer micronized composite may have an average particle size of less than or equal to about 100 μm, for example, less than or equal to about 70 μm, or less than or equal to about 50 μm. The quantum dot-polymer micronized composite may have an average particle size of greater than or equal to about 1 μm, for example, greater than or equal to about 5 μm, greater than or equal to about 10 μm, or greater than or equal to about 15 μm. The quantum dot-polymer micronized composite may show improved or desirable uniformity. For example, the average particle size of the quantum dot-polymer micronized composite may have a standard deviation of less than or equal to about 15 μm, for example, less than or equal to about 13 μm.

Another embodiment provides an article including a second polymer matrix; and the quantum dot-polymer micronized composite dispersed in the second polymer matrix.

The second polymer matrix may include a silicone resin; an epoxy resin; poly(meth)acrylate; an organic/inorganic hybrid polymer; a polycarbonate; a polystyrene; a polyolefin; a thiol-ene polymer; or a combination thereof. These resins are the same as described above. The article may have a film shape such as a quantum dot sheet, or a product formed in a mold having another predetermined shape.

The article may be obtained by adding the above quantum dot-polymer micronized composite to a second polymer matrix to obtain a mixture, applying the mixture in a method of coating, casting, or the like to have a desired shape, and drying or curing it. Specific production methods are disclosed in Korean Patent Publication No. 10-2012-0137136 and US 2015-0218444 A1, which are incorporated herein by reference in their entirety.

In another embodiment, an electronic device includes the quantum dot-polymer micronized composite. For example, the electronic device may include the article. The electronic device may be a display, a luminous device, and the like. The device may be manufactured by any suitable method, and a specific structure thereof is known.

Figure 4:
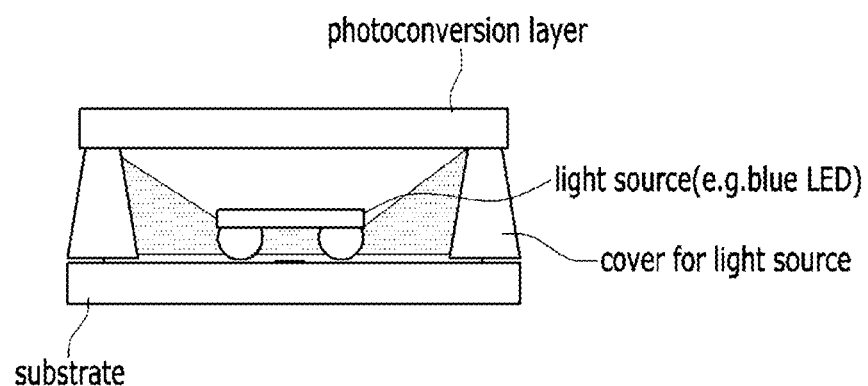
FIG. 4 is a cross-sectional view of a device including an article (light conversion layer) according to an embodiment of the disclosure.

For example, the device may have a structure as shown in FIG. 4. Referring to FIG. 4, a luminous device has a light source (e.g., a blue LED) on a substrate and a photoconversion layer (e.g., a film including the above quantum dot-polymer micronized composite, etc.) thereon and thus emits light by transforming the wavelength of incident light from the light source.

Hereinafter, the embodiments are illustrated in more detail with reference to examples. However, they are exemplary embodiments of the present invention, and the present invention is not limited thereto.

EXAMPLES

Analysis:
[1] SEM Analysis:
A scanning electron microscope (Manufacturer: FEI, Model No.: NOVA NANO SEM 450) is used to perform a scanning electron microscope analysis.
[2] TEM, HAADF STEM Analysis:
A transmission electron microscope analysis is performed by using an Osiris S/TEM (FEI) equipment at an acceleration voltage of 200 kilovolts (KV). The STEM HAADF analysis is performed in an image mode.
[3] Microscope Analysis:
A microscope analysis is performed by using an optical microscope (Manufacturer: Nikon, Model No.: Eclipse LV 100).
[4] UV Spectroscopic Analysis
A UV spectroscopic analysis is performed by using an Agilent Technologies Cary Series UV-Vis-NIR spectrophotometer, obtaining a UV-Visible absorption spectrum.
[5] Photoluminescent Spectroscopic Analysis A photoluminescent spectroscopic analysis is performed by using a CAS 140 CT spectrometer, obtaining a photoluminescent (PL) spectrum.

[6] Photoconversion Efficiency

A LED device is operated at 270 milliamperes (mA), obtaining the spectrum of emitted light. From the obtained spectrum, photoconversion efficiency is obtained according to the following equation:

Photoconversion efficiency(C.E. %)=(green or red light-emitting peak area)/(luminous area of blue LED chip before green or red light emission−blue light-emitting area during green or red light emission)×100

[7] Color Coordinate Cx, Cy

Luminance and color coordinates are measured in an integrating sphere by operating the LED device at 270 mA, obtaining the color coordinates Cx and Cy.

Reference Example 1: Production of Green Quantum Dot (1) 0.2 mmol of indium acetate, 0.125 mmol of zinc acetate, 0.8 mmol of palmitic acid, and 10 mL of 1-octadecene are put in a reactor and heated at 120° C. under vacuum. One hour later, an atmosphere in the reactor is converted into nitrogen. After heating the reactor at 280° C., a mixed solution of 0.15 mmol of tris(trimethylsilyl)phosphine (TMS3P) and 1 mL of trioctylphosphine is rapidly injected thereinto, and the mixture is reacted for 10 minutes. The resultant is rapidly cooled down at room temperature, acetone is added thereto, and a precipitate obtained by centrifuging the mixture is dispersed in toluene. The obtained InZnP semiconductor nano crystal shows an UV first absorption maximum wavelength ranging from 440 to 460 nm.

0.3 mmol (0.056 g) of zinc acetate, 0.6 mmol (0.189 g) of oleic acid, and 10 mL of trioctylamine are put in a reaction flask and vacuum-treated at 120° C. for 10 minutes. After charging the reaction flask with $N_2$, the reaction flask is heated up to 220° C. Then, the above toluene dispersion having the InZnP semiconductor nano crystal core is added thereto within 10 seconds, a mixed solution of 0.01 mmol of Se/TOP (i.e., selenium dispersed/dissolved in trioctyl phosphine) and 0.05 mmol of S/TOP is slowly injected thereinto, and the mixture is heated up to 280° C. and reacted for 20 minutes. Subsequently, the resultant is heated up to 320° C., Se and S by changing their mixing ratio are injected thereinto, and the mixture is reacted for 20 minutes. Then, 0.15 mmol of S/TOP (i.e., sulfur dispersed/dissolved in trioctyl phosphine) is added thereto, and the obtained mixture is additionally reacted for 20 minutes and rapidly cooled down to room temperature, obtaining a reactant including an InZnP/ZnSeS quantum dot.

(2) An excess amount of ethanol is added to the reactant including an InZnP/ZnSeS quantum dot, and the mixture is centrifuged, thereby removing any extra organic material in the quantum dot reactant. After the centrifuging, a supernatant is removed therefrom, a precipitate therefrom is dissolved in hexane again, and an excess amount ethanol is added thereto, and the obtained mixture is centrifuged again. This centrifuged precipitate is dried and then dispersed in toluene. The synthesized nano crystal has a luminous wavelength of 534 nm and a quantum yield (QY) of 80%.

Reference Example 2: Production of Red Quantum Dot (1) 0.2 mmol of indium acetate, 0.6 mmol of palmitic acid, and 10 mL of 1-octadecene are put in a reactor and heated at 120° C. under vacuum. One hour later, the reactor is charged with nitrogen. After heating the reactor at 280° C., a mixed solution of 0.1 mmol of TMS3P and 0.5 mL of trioctylphosphine are rapidly injected thereinto, and the mixture is reacted for 20 minutes. The reaction solution is rapidly cooled down to room temperature, acetone is added thereto, and a precipitate obtained by centrifuging the mixture is dispersed in toluene. The obtained InP semiconductor nano crystal core has a UV first absorption maximum wavelength ranging from 560 to 590 nm.

0.3 mmol (0.056 g) of zinc acetate, 0.6 mmol (0.189 g) of oleic acid, and 10 mL of trioctylamine are put in a reaction flask and vacuum-treated at 120° C. for 10 minutes. After charging the reaction flask with $N_2$, the reaction flask is heated up to 220° C. The above toluene dispersion of the InP semiconductor nano crystal core is added thereto within 10 seconds, 0.6 mmol of S/TOP is slowly added thereto, and the obtained mixture is heated up to 280° C. again and reacted for 30 minutes.

The synthesized nanocrystal has a photoluminescent wavelength of 619 nm and a quantum yield (QY) of 85%.

Production of Micronized Composite

Example 1-1

The toluene dispersion including the green InZnP/ZnSeS semiconductor nano crystal according to Reference Example 1 [Optical Density (OD)×mL=1.0] is prepared.

A clay dispersion is prepared by dispersing a clay having a quaternary ammonium salt including three C8 linear alkyl groups on the surface (Manufacturer: Co-op Chemical Co., Ltd., Product Name: STN) is dispersed into toluene.

Polyethylene-co-polyacrylic acid (Manufacturer: DuPont, Product Name: NUCREL, Acrylic acid weight ratio: 15%) is dissolved in toluene at 110° C. under a nitrogen atmosphere, preparing a polymer solution. The weight of a polymer therein is adjusted to have a quantum dot (OD×mL)/polymer ratio of 0.7. The toluene present in an amount of 10 times the weight of the polymer. The clay is used in an amount of 20 parts by weight per 100 parts by weight of the polymer.

The quantum dot dispersion and the clay dispersion are added to the prepared polymer solution, and the mixture is reacted at 110° C. for 30 minutes. Then, diethylzinc is added to the reaction mixture in a dropwise fashion for bonding the quantum dot, the clay particle, and the polymer, and the resulting mixture is rapidly cooled down, forming a precipitate.

The precipitate is filtered, washed with hexane, and dried in the room temperature air, obtaining a quantum dot-polymer-clay composite. The composite is pulverized with a mortar and a pestle, provide a composite powder. The composite powder is washed several times with hexane and vacuum-dried at room temperature.

Example 1-2

A quantum dot-polymer-clay composite is obtained according to the same method as Example 1-1 except for using the red quantum dot according to Reference Example 2. The composite is pulverized with a mortar and a pestle to provide a composite powder. This composite powder is washed several times with hexane and vacuum-dried at room temperature for 12 hours.

Comparative Example 1-1

A (green) quantum dot-polymer composite is obtained according to the same method as Example 1-1, except for adding no clay dispersion to the polymer solution.

The prepared quantum dot-polymer composite is washed several times with hexane and then stored in hexane. The composite is pulverized with hexane by using a cryogenic ball mill (Manufacturer: Japan Analytical Industry, Co., Ltd., JFC-2000) in a liquid nitrogen bath, to provide a composite powder (50 Hz, 5 minutes, repetitively 4 times). The powder is washed several times with hexane and vacuum-dried at room temperature for 12 hours.

Comparative Example 1-2

A (red) quantum dot-polymer composite is obtained according to the same method as Example 1-2 except for adding no clay dispersion to the polymer solution.

The prepared quantum dot-polymer composite is washed several times with hexane and stored in hexane.

The chunk (i.e., the composite) is pulverized with hexane by using a cryogenic ball mill (Manufacturer: Japan Analytical Industry, Co., Ltd., JFC-2000) in liquid nitrogen bath, to provide a composite powder (50 Hz, 5 minutes, repetitively 4 times). The powder is washed several times with hexane and vacuum-dried at room temperature for 12 hours.

Example 2

A quantum dot-polymer-clay composite is obtained according to the same method as Example 1-1 except for using the clay in an amount of 40 parts by weight per 100 parts by weight of the polymer. The obtained composite is pulverized with a mortar and a pestle, to provide a composite powder. The obtained composite powder is washed several times with hexane and vacuum-dried at room temperature for 12 hours.

Experimental Example 1: Scanning Electron Microscope Analysis of Micronized Composite Powder Each composite powder according to Examples 1-1 and 2 and Comparative Example 1-1 is analyzed by scanning electron microscopy, and the results are respectively provided in FIGS. 5, 6, and 7. Each FIG. has the dimensions of 20 μm×20 μm.

Figure 5:
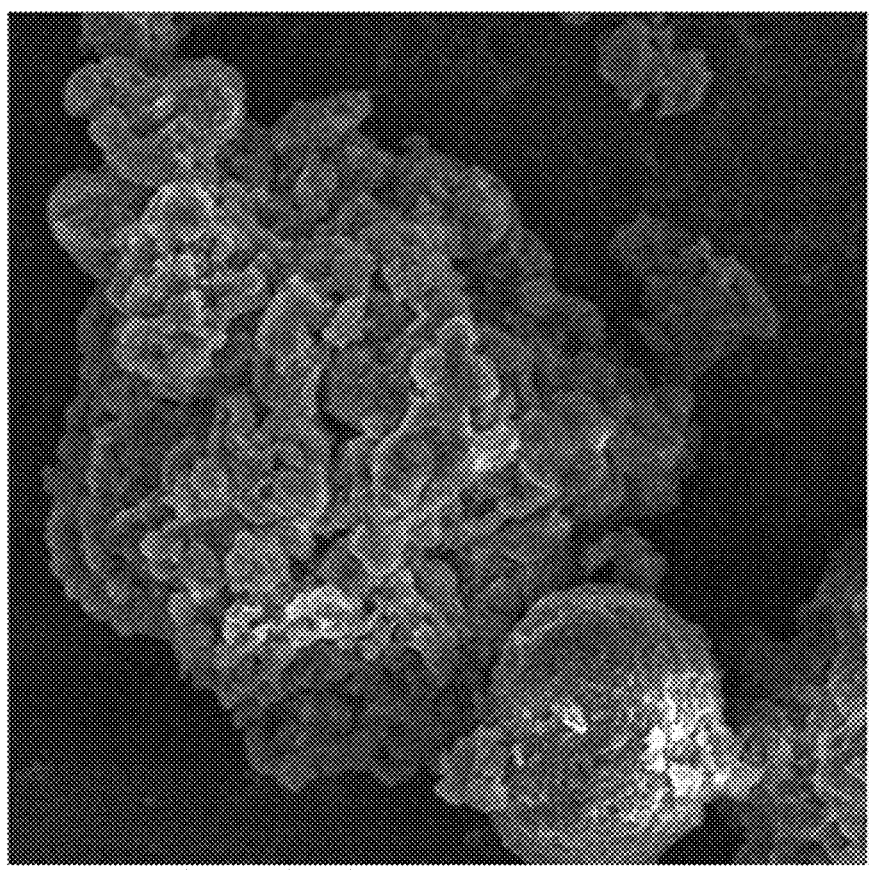
FIG. 5 is a scanning electron microscope image of the micronized composite of Example 1-1.
Figure 6:
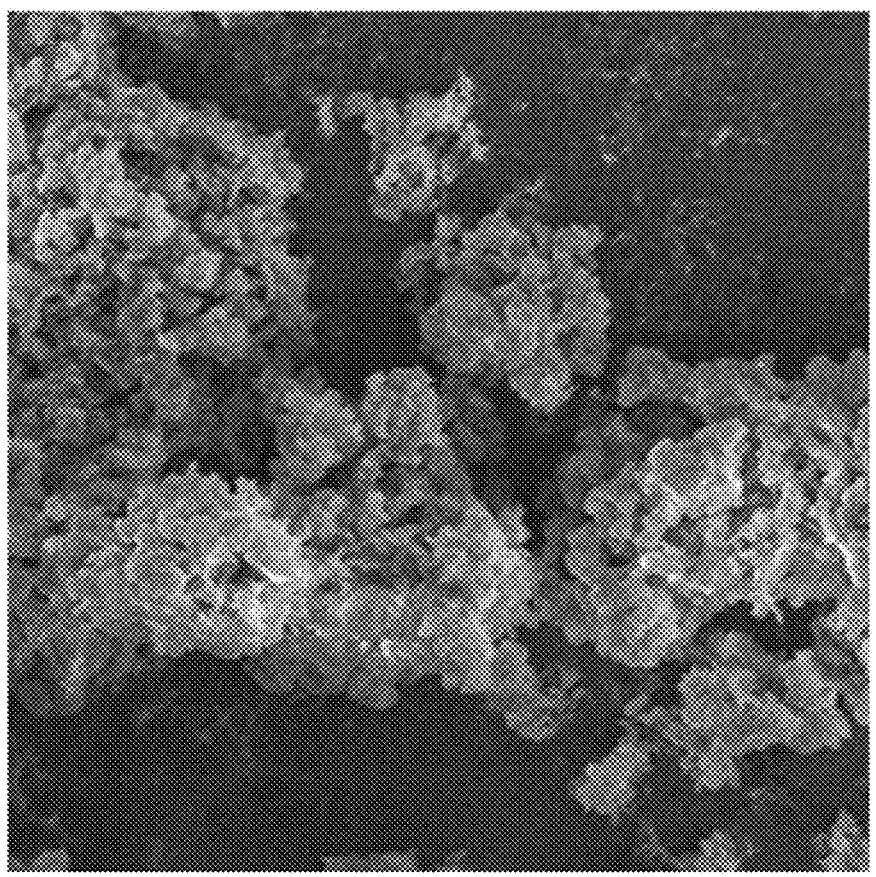
FIG. 6 is a scanning electron microscope image of the micronized composite of Example 2.
Figure 7:
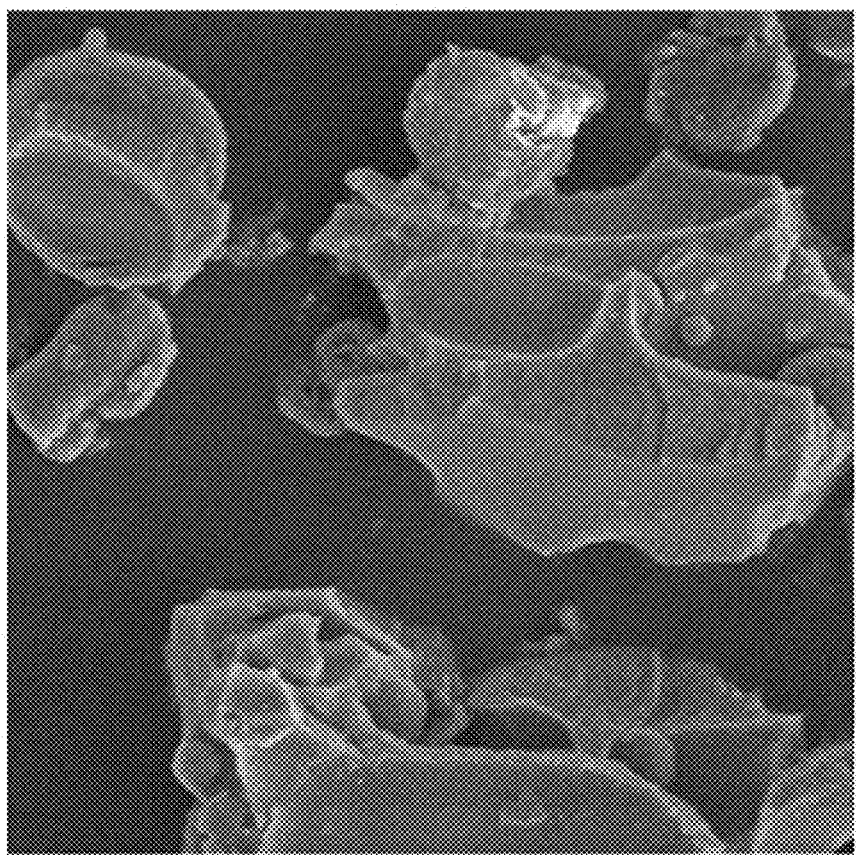
FIG. 7 is a scanning electron microscope image of the micronized composite according to Comparative Example 1-1.

Referring to the results of FIGS. 5, 6, and 7, cohesion among particles is decreased as the amount of clay in a composite is increased.

The results of FIGS. 5 and 6 show that a composite including clay may form a particulate having a size of less than of 50 μm after pulverizing with a mortar and a pestle.

Experimental Example 2: Transmission Electron Microscope (TEM) and HAADF STEM Analysis of Micronized Composite Powder

[1] The micronized composite of Example 1-1 is mixed with a thiol-ene-based photoinitiating resin, obtaining a composition. Herein, the thiol-ene is prepared by mixing pentaerythritol tetrakis(3-mercaptopropionate) and 1,3,5-triallyl-1,3,5-triazine-2,4,6(1H, 3H, and 5H)-trione with TPO (trimethylbenzoyl diphenyl phosphine oxide, BASF) as a photoinitiator, which are respectively within a weight range of 40-60%, 60-40%, and 0.5-3%.

The composition is coated on a release film with a wire bar, photocured by radiating with UV light (light dose: 2000 millijoules per square centimeter ($mJ/cm^2$)), obtaining a 100 μm-thick composite film.

Figure 8:
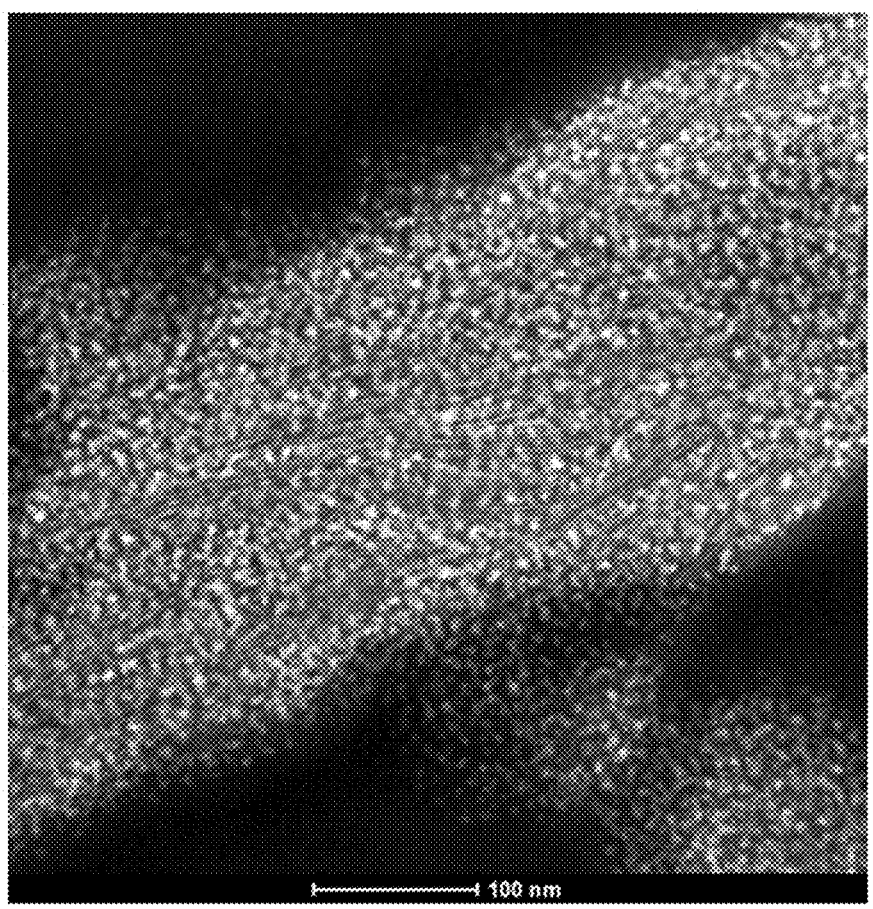
FIG. 8 is a transmission electron microscope image showing a cross-section of the quantum dot-polymer micronized composite according to Experimental Example 2.
Figure 9:
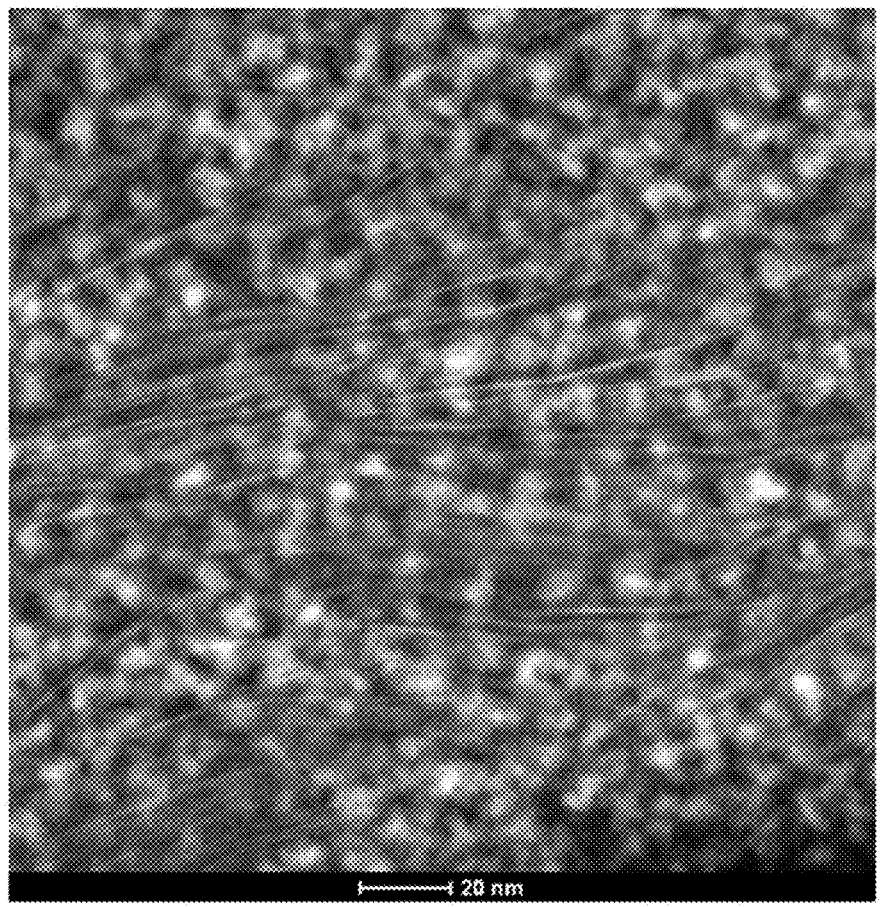
FIG. 9 is a transmission electron microscope image showing a cross-section of the quantum dot-polymer micronized composite according to Experimental Example 2.
Figure 10:
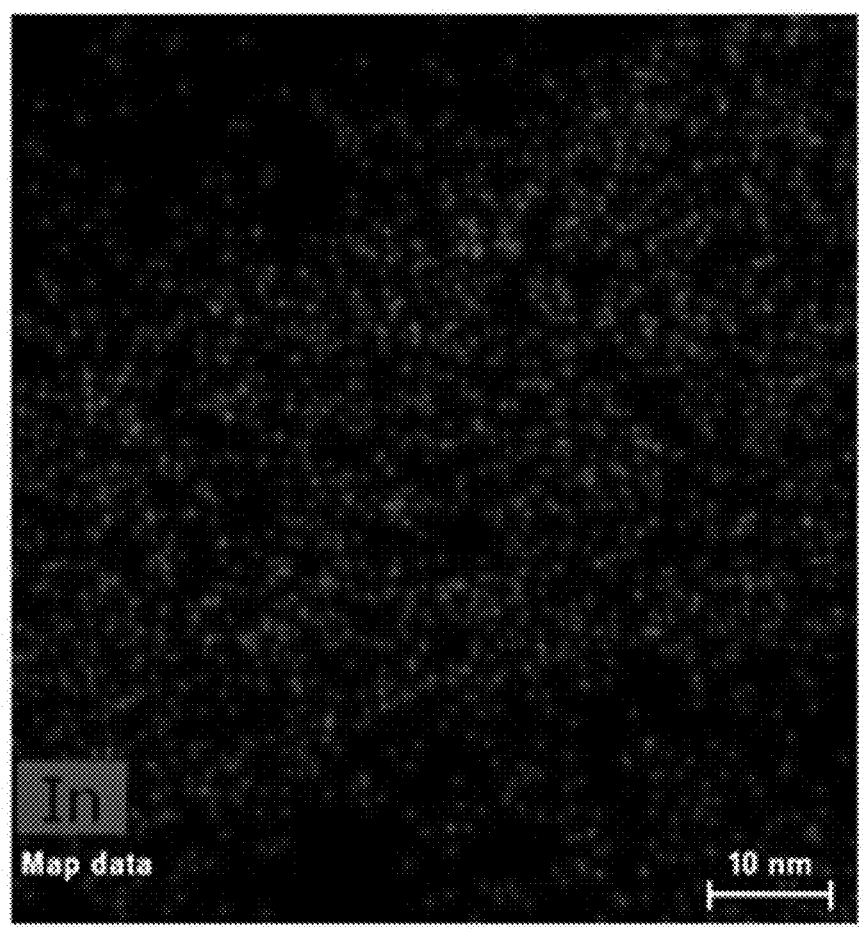
FIG. 10 is a high angle annular dark field scanning transmission electron microscopy (HAADF STEM) image showing a cross-section of the quantum dot-polymer micronized composite according to Experimental Example 2.
Figure 11:
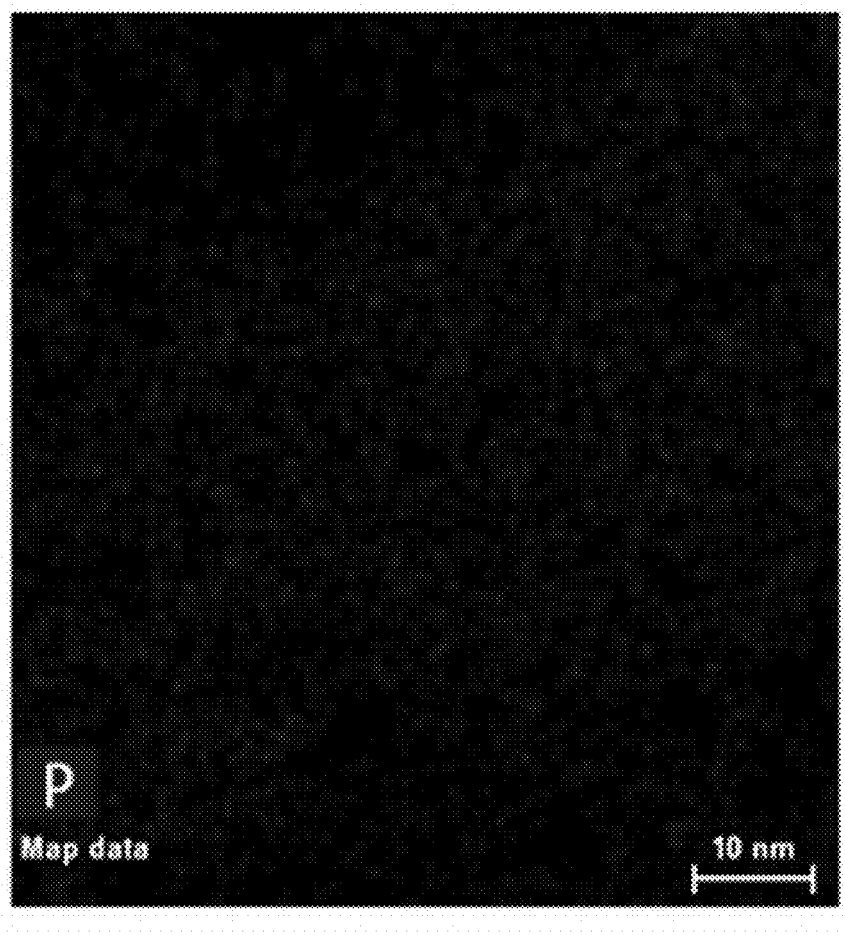
FIG. 11 is a HAADF STEM image showing a cross-section of the quantum dot-polymer micronized composite according to Experimental Example 2.
Figure 12:
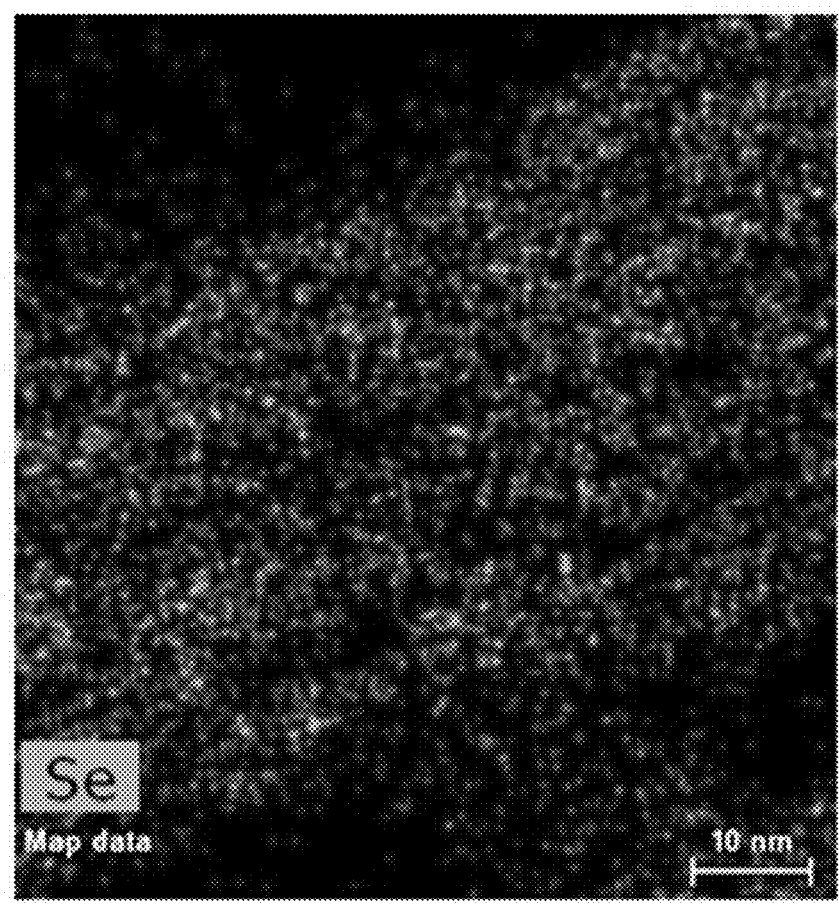
FIG. 12 is a HAADF STEM image showing a cross-section of the quantum dot-polymer micronized composite according to Experimental Example 2.
Figure 13:
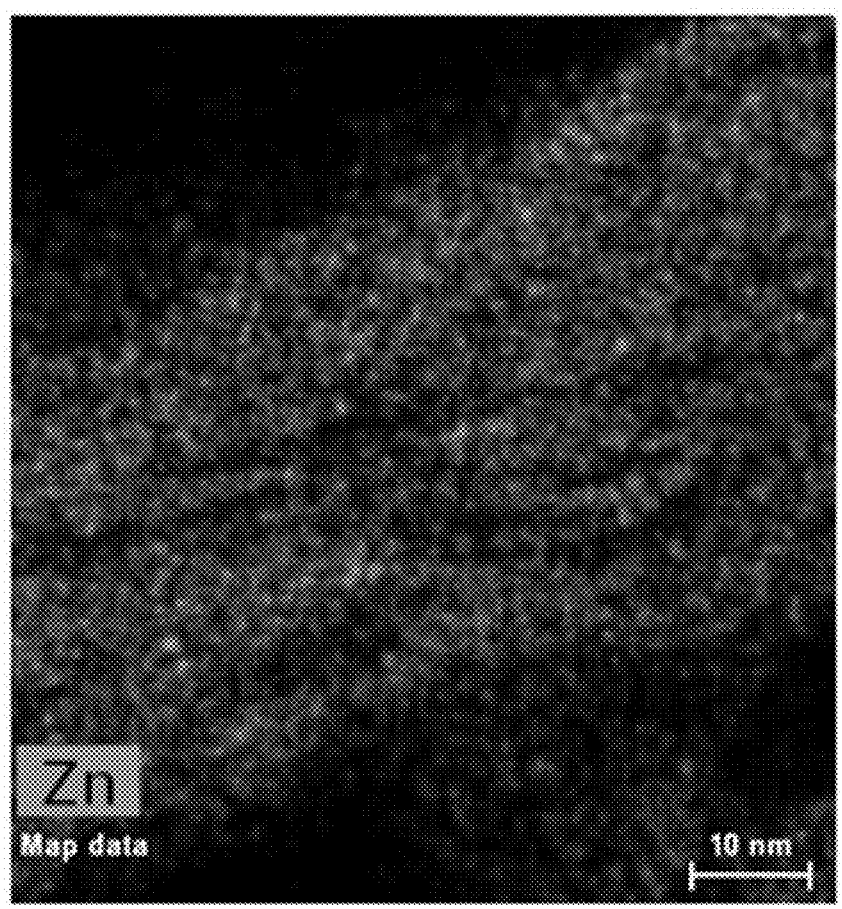
FIG. 13 is a HAADF STEM image showing a cross-section of the quantum dot-polymer micronized composite according to Experimental Example 2.
Figure 14:
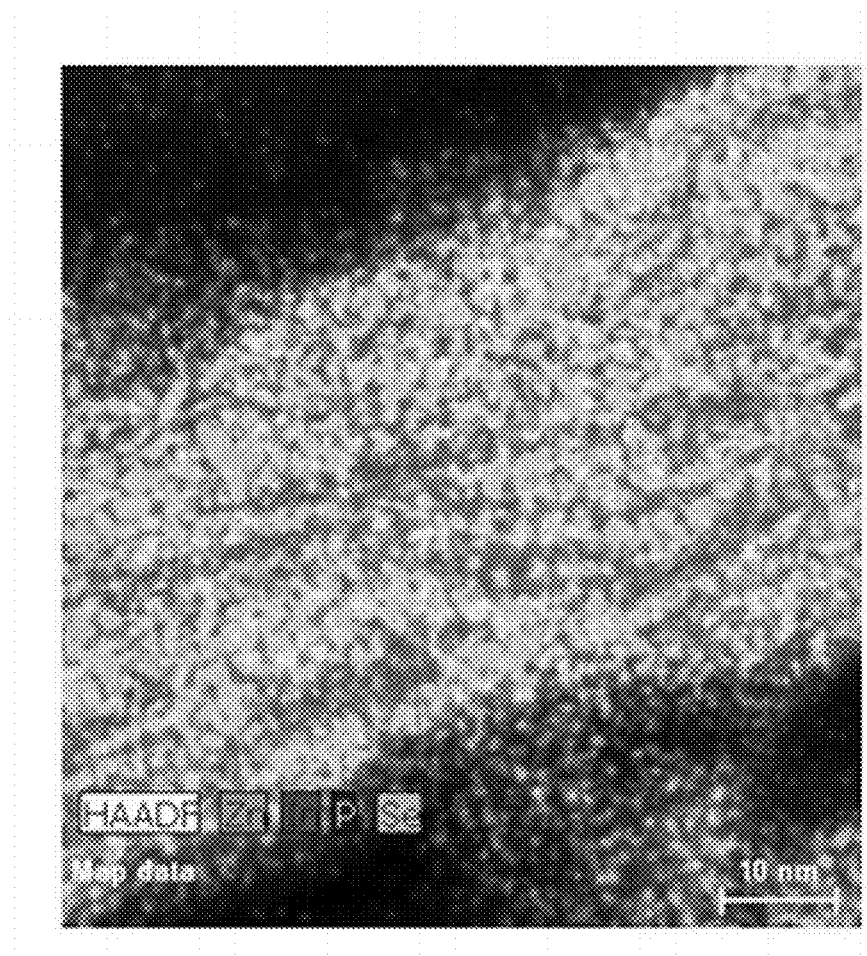
FIG. 14 is a HAADF STEM image showing a cross-section of the quantum dot-polymer micronized composite according to Experimental Example 2.

[2] The obtained film is processed with a focused ion beam (FIB), and the cross section of the film is examined with a transmission electron microscope. The results are provided in FIGS. 8 and 9. A HAADF STEM analysis is performed about the cross section of the film, and the results are provided in FIGS. 10 to 14.

The TEM analysis results (FIGS. 8 and 9) and the HAADF STEM analysis results (FIGS. 10 to 14) show that quantum dots are uniformly dispersed in a polymer, and clay sheet-shaped particle (platelet) layers are filled in the polymer. At least two clay sheet-shaped particles are disposed with their flat sides facing each other, and the polymers and the quantum dots are present among the clay layers.

Experimental Example 3: Particle Size Analysis of Micronized Composite

[1] The composite powder according to Example 1-1 is mixed with nano-sized amorphous alumina particles (Aluc) with a mortar and a pestle, and the mixture is added to a silicone resin (OE7842A×5B, Manufacturer: Dow Corning), preparing a composition. The obtained composition is charged in a glass cup (an internal size: width 1.7×length 5.2×height 0.55 mm) and cured under a nitrogen atmosphere, obtaining a specimen. The curing is performed at 80° C. for 30 minutes and 150° C. for 1 hour.

From the specimen, twenty five relatively large particles are taken out of the composite powder particles, and then, their sizes (diameters) are measured, and the results are provided in Table 1.

[2] A specimen is obtained according to the same method as the above [1] except for using the composite powder according to Comparative Example 1-1. From the specimen, twenty five relatively large particles are taken from the composite powder particles, and then, their sizes (diameters) are measured, and the results are provided in Table 1.

[3] A specimen is obtained according to the same method as the above [1] except for using the composite powder according to Example 1-2. From the specimen, twenty five relatively large particles are taken from the composite powder particles, and then, their sizes (diameters) are measured, and the results are provided in Table 1.

[4] A specimen is obtained according to the same method as the above [1] except for using the composite powder according to Comparative Example 1-2. From the specimen, twenty five relatively large particles are taken from the composite powder, and then, their sizes (diameters) are measured, and the results are provided in Table 1.

TABLE 1

|  | Average size (μm) | Standard deviation |
| --- | --- | --- |
| Example 1-1 | 37.56 | 8.23 |
| Comparative Example 1-1 | 47.87 | 13.05 |
| Example 1-2 | 42.4 | 12.76 |
| Comparative Example 1-2 | 70.94 | 15.23 |

Referring to the result of Table 1, the green quantum dot-polymer micronized composite of Example 1-1 may have a relatively small average size and a more uniform particle size distribution compared with the green quantum dot-polymer micronized composite using the same quantum dot as Example 1-1 but including no clay particle according to Comparative Example 1-1. In addition, the red quantum dot-polymer micronized composite of Example 1-2 may have a significantly small average size and a more uniform particle size distribution compared with the red quantum dot-polymer micronized composite using the same quantum dot as Example 1-2 but including no clay particle according to Comparative Example 1-2. Referring to the above results, according to the method of Examples, a micronized composite powder having a small size and a uniform size distribution may be produced by hand milling without a cryogenic milling process that requires expensive equipment.

Example 3

A quantum dot-polymer-clay composite is obtained according to the same method as Example 1-1 except for using the clay in an amount of 10 parts by weight per 100 parts by weight of the polymer and adjusting the weight of the polymer into 1.0 of quantum dot (OD×mL)/polymer. The composite is pulverized with a mortar and a pestle, to provide a composite powder.

The composite powder is washed several times with hexane and vacuum-dried at room temperature. The micronized composite particle has an average particle size and a standard deviation similar to those of Example 1-1.

Example 4

A quantum dot-polymer-inorganic salt composite is obtained according to the same method as Example 3 except for using a red quantum dot and adding a $ZnCl_2$ solution prepared by dissolving $ZnCl_2$ instead of the clay in a concentration of 10% in ethanol to a polymer solution. The $ZnCl_2$ is used in an amount of 27 parts by weight per 100 parts by weight of the polymer.

The composite is pulverized with a mortar and a pestle, to provide a composite powder. The composite powder is washed several times with hexane and vacuum-dried at room temperature. A micronized composite particle obtained therefrom has an average size and a standard deviation within a similar range to those of Example 1-2.

Experimental Examples 4 and 5: Photoconversion Efficiency of Article Including Micronized Composite

[1] A sample including no additive is obtained from Comparative Example 1-1.

[2] The micronized composite of Example 3 is mixed with a thiol-ene photocurable resin in a weight ratio of micronized composite:thiol-ene=1:30. About 30 mg of the composition is coated on a blue LED light source as a SMD (surface mount device) and cured by radiating with UV light (2000 mJ/cm$^2$). Each of the five devices manufactured as above is operated with a current of 270 mA, obtaining a photoluminescent spectrum. From the photoluminescent spectrum, photoconversion efficiency and Cy are measured, and the results are provided in FIG. 15.

Figure 15:
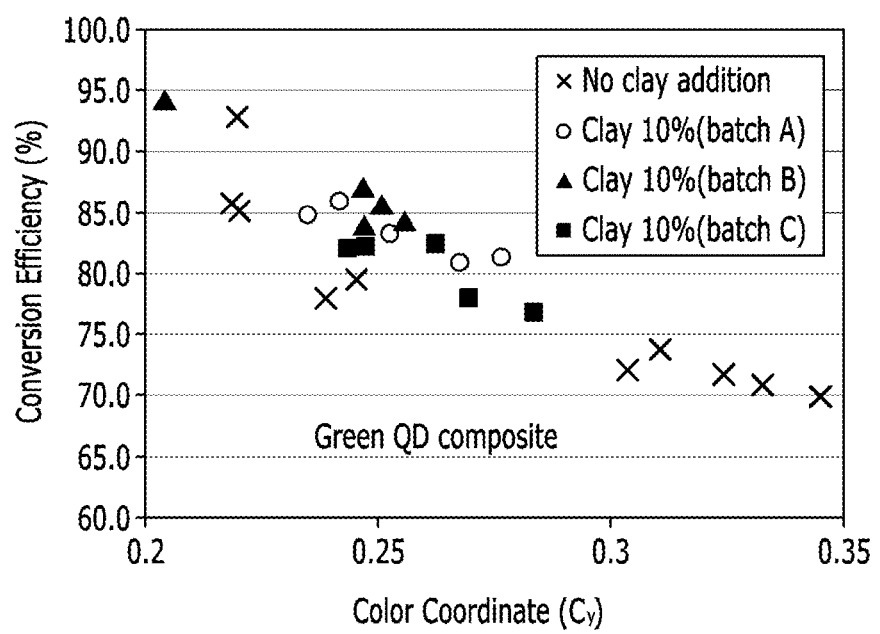
FIG. 15 is a graph of conversion efficiency (C.E., %) versus color coordinate (Cy) and shows the photoconversion efficiency depending on a color coordinate Cy of light conversion layers including the quantum dot-polymer micronized composite produced in Experimental Example 4.

Referring to the results of FIG. 15, the micronized composite of Example 3 shows improved luminous properties compared with a composite including no clay. In addition, a method of manufacturing the micronized composite of Example 3 is repeated (for batch B, batch C) and a reproducible result is obtained.

[3] The micronized composite of Example 4 is mixed with a thiol-ene photocurable resin in a weight ratio of micronized composite:thiol-ene resin=1:50. About 30 mg of the composition is coated on a blue LED light source produced as SMD (a surface mount device) and irradiated with UV light (2000 mJ/cm$^2$). Each of the 5 devices is operated with a current of 270 mA to obtain a photoluminescent spectrum. From the photoluminescent spectrum, photoconversion efficiency and Cx are measured, and the results are provided in FIG. 16.

Figure 16:
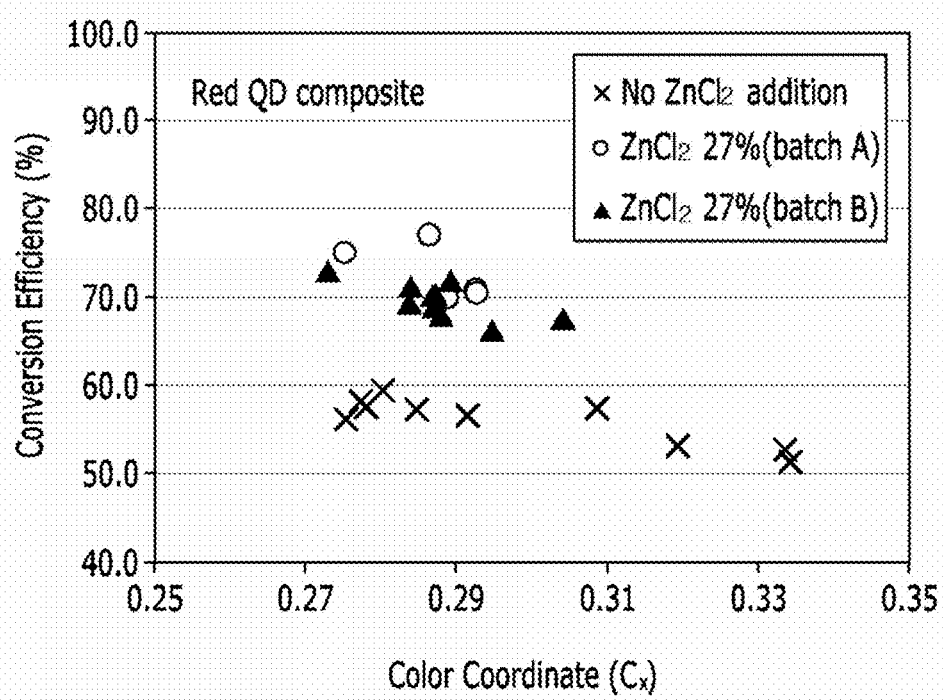
FIG. 16 is a graph of conversion efficiency (C.E., %) versus color coordinate (Cx) and shows photoconversion efficiency depending on a color coordinate Cx of light conversion layers including the quantum dot-polymer micronized composite produced in Experimental Example 5.

Referring to FIG. 16, the micronized composite of Example 4 shows higher luminous properties compared with a composite including no inorganic salt, such as zinc chloride. In addition, a method of manufacturing the micronized composite of Example 4 is repeated (for batch B) and a reproducible result is obtained.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot-polymer micronized composite comprising
   a first polymer matrix; and
   a plurality of quantum dots dispersed in the first polymer matrix;
   wherein the quantum dot-polymer micronized composite comprises at least one additive selected from a clay particle embedded in the first polymer matrix and a metal halide dispersed in the first polymer matrix, and
   wherein the quantum dot-polymer micronized composite has an average particle size of less than or equal to about 100 micrometers.

2. The quantum dot-polymer micronized composite of claim 1, wherein the first polymer matrix comprises a polyacrylate, a polymethacrylate, polyacrylic acid, a polyacrylate salt, a polymethacrylic acid, a polymethacrylate salt, a polyolefin, a polystyrene, a poly(alkylene-co-acrylic acid), a poly(alkylene-co-acrylate salt), a poly(alkylene-co-methacrylic acid), a poly(alkylene-co-methacrylate salt), a poly(styrene-co-acrylic acid), a poly(styrene-co-methacrylic acid), a poly(styrene-co-thiol-terminated ethylene), a thiol-ene polymer, a polyamide, a polyimide, a polyisocyanate, a polythiol, a polyester, or a combination thereof.

3. The quantum dot-polymer micronized composite of claim 1, wherein the first polymer matrix comprises a polymer having a functional group capable of reacting with a quantum dot of the plurality of quantum dots.

4. The quantum dot-polymer micronized composite of claim 3, wherein the functional group is selected from
   a —COOR group, wherein R is a hydrogen atom, a monovalent organic functional group, or a monovalent to trivalent metal ion,
   a —RCOOR' group, wherein R is a substituted or unsubstituted C1 to C10 alkylene group and R' is a hydrogen atom, a monovalent organic functional group, or a monovalent to trivalent metal ion,
   a substituted or unsubstituted C2 to C20 alkenyl group,
   a substituted or unsubstituted C2 to C20 alkynyl group,
   a halide moiety,
   an —ROR' group, wherein R is a substituted or unsubstituted C1 to C10 alkylene group and R' is a hydrogen atom, a monovalent organic functional group, or a monovalent to trivalent metal ion,
   a RCOX group, wherein R is a substituted or unsubstituted C1 to C10 alkylene group and X is F, Cl, Br, or I,
   a —CONRR' group, wherein R and R' are each independently a hydrogen, a monovalent organic functional group, or a monovalent to trivalent metal ion, a —NRR' group, wherein R and R' are each independently a hydrogen or a monovalent organic functional group, a —N(R')— group, wherein R' is a hydrogen, a monovalent organic functional group, or a monovalent to trivalent metal ion, a —C(=O)NC(=O)— group, a —N=C=O group, a —OC(=O)—C(H)=CH$_2$ group, a —OC(=O)—C(CH$_3$)=CH$_2$ group, a —SH group, a —P(=O)R'R" group, wherein R' and R" are each independently a hydrogen atom, a monovalent organic functional group, or a monovalent to trivalent metal ion, a —SO$_3$R' group, wherein R' is a hydrogen atom, a monovalent organic functional group, or a monovalent to trivalent metal ion, a —NO$_2$ group, or a combination thereof.

5. The quantum dot-polymer micronized composite of claim 1, wherein a quantum dot of the plurality of quantum dots comprises a Group II-VI compound, a Group III-V compound, a Group IV-VI compound, a Group IV element or compound, a Group I-IV compound, a Group compound, a Group I-II-IV-IV compound, or a combination thereof.

6. The quantum dot-polymer micronized composite of claim 1, wherein the quantum dot-polymer micronized composite comprises the clay particle, and wherein the clay particle has a planate surface, an average thickness of less than or equal to about 10 nanometers, and a lateral size of about 50 nanometers to about 10 micrometers.

7. The quantum dot-polymer micronized composite of claim 1, wherein the clay particle is modified with an organic compound having a heteroatom and a hydrocarbyl group linked to the heteroatom.

8. The quantum dot-polymer micronized composite of claim 7, wherein the organic compound is selected from an amine, an ammonium salt, a phosphine, a phosphonium salt, an amine group-containing thiol, a mercapto group-containing silane, or a combination thereof.

9. The quantum dot-polymer micronized composite of claim 7, wherein the organic compound comprises an amine compound having at least one substituted or unsubstituted C6 to C20 hydrocarbyl linked to a nitrogen atom, a quaternary ammonium salt compound having at least one substituted or unsubstituted C6 to C20 hydrocarbyl linked to a nitrogen atom, a phosphine compound having at least one substituted or unsubstituted C6 to C20 hydrocarbyl linked to a phosphorus atom, a phosphonium salt compound having at least one substituted or unsubstituted C6 to C20 hydrocarbyl linked to a phosphorus atom, a mercaptan compound having at least one C6 to C20 hydrocarbyl having an amine group, an alkoxysilane compound having a mercaptoalkyl group, or a combination thereof.

10. The quantum dot-polymer micronized composite of claim 1, wherein the quantum dot-polymer micronized composite comprises the clay particle, and wherein the clay particle comprises smectite, mica, vermiculite, montmorillonite, iron-containing montmorillonite, beidellite, saponite, hectorite, stibensite, nontronite, anionic, zirconium phosphate, kaolinite, atapulgite, illite, halloysite, diatomaceous earth, fuller's earth, calcined aluminium silicate, hydrated aluminium silicate, magnesium aluminium silicate, sodium silicate, magnesium silicate, or a combination thereof.

11. The quantum dot-polymer micronized composite of claim 1, wherein an amount of the additive is about 1 part by weight to about 50 parts by weight per 100 parts by weight of the first polymer matrix.

12. The quantum dot-polymer micronized composite of claim 1, wherein in the composite, a planate surface of at least two clay particles face each other, and the plurality of quantum dots dispersed in the first polymer matrix are disposed between the at least two clay particles.

13. The quantum dot-polymer micronized composite of claim 1, wherein the quantum dot-polymer micronized composite comprises the metal halide, and wherein the metal halide comprises an alkali metal, an alkaline-earth metal, or a transition metal and a fluoride, a chloride, a bromide, or an iodide.

14. The quantum dot-polymer micronized composite of claim 1, wherein the composite further comprises a polymer overcoating disposed on at least part of a surface thereof.

15. The quantum dot-polymer micronized composite of claim 1, wherein the composite further comprises a hydrocarbyl chloride.

16. An article comprising
a second polymer matrix; and
the quantum dot-polymer micronized composite of claim 1 dispersed in the second polymer matrix.

17. The article of claim 16, wherein the second polymer matrix comprises a silicone resin; an epoxy resin; a poly(meth)acrylate; an organic/inorganic hybrid polymer; a polycarbonate; a polystyrene; a polyolefin; a thiol-ene polymer; or a combination thereof.

18. The article of claim 16, wherein the article has a film shape.

19. A method of producing the quantum dot-polymer micronized composite of claim 3, comprising
dissolving a polymer having a functional group capable of reacting with the plurality of quantum dots in a first organic solvent under an inert atmosphere to prepare a polymer solution;
adding the plurality of quantum dots and at least one additive selected from a clay particle and a metal halide to the polymer solution to obtain a mixture;
heating the mixture to perform a reaction between the plurality of quantum dots and the polymer;
forming a precipitate from the mixture; and
separating the formed precipitate.

20. The method of claim 19, wherein the polymer comprises a polyacrylate, a polymethacrylate, a polyacrylic acid, a polyacrylate salt, a polymethacrylic acid, a polymethacrylate salt, a polyolefin, a polystyrene, a poly(alkylene-co-acrylic acid), a poly(alkylene-co-acrylate salt), a poly(alkylene-co-methacrylic acid), a poly(alkylene-co-methacrylate salt), a poly(styrene-co-acrylic acid), a poly(styrene-co-methacrylic acid), a poly(styrene-co-thiol-terminated ethylene), a thiol-ene polymer, a polyamide, a polyimide, a polyisocyanate, a polythiol, a polyester, or a combination thereof, in its backbone, and
the functional group comprises a —COOR group, wherein R is a hydrogen atom, a monovalent organic functional group, or a monovalent to trivalent metal ion, a —RCOOR' group, wherein R is a substituted or unsubstituted C1 to C10 alkylene group and R' is a hydrogen atom, a monovalent organic functional group, or a monovalent to trivalent metal ion; a substituted or unsubstituted C2 to C20 alkenyl group, a substituted or unsubstituted C2 to C20 alkynyl group; a halide moiety, a —ROR' group, wherein R is a substituted or unsubstituted C1 to C10 alkylene group and R' is a hydrogen atom, a monovalent organic functional group, or a monovalent to trivalent metal ion, a —RCOX group, wherein R is a substituted or unsubstituted C1 to C10 alkylene group and X is F, Cl, Br, or I, a —CONRR' group, wherein R and R' are each independently a hydrogen atom, a monovalent organic functional group, or a monovalent to trivalent metal ion, a —NRR' group, wherein R and R' are each independently a hydrogen atom or a monovalent organic functional group, a —N(R')— group, wherein R' is a hydrogen atom, a monovalent organic functional group, or a monovalent to trivalent metal ion; a —C(=O)NC(=O)— group; a —N=C=O group, a —OC(=O)—C(H)=CH$_2$ group, a —OC(=O)—C(CH$_3$)=CH$_2$ group, a —SH group, a —P(=O)R'R" group, wherein R' and R" are each independently a hydrogen atom, a monovalent organic functional group, or a monovalent to trivalent metal ion, a —SO$_3$R' group, wherein R' is a hydrogen atom, a monovalent organic functional group, or a monovalent to trivalent metal ion, a —NO$_2$ group, or a combination thereof.

21. The method of claim 19, wherein the adding of the plurality of quantum dots and the additive to the polymer solution comprises simultaneously or sequentially adding a quantum dot dispersion and an additive dispersion to the polymer solution, wherein the quantum dot dispersion is prepared by dispersing the quantum dots in a second organic solvent miscible with the first organic solvent, and wherein the additive dispersion is prepared by dispersing the additive in a third organic solvent miscible with the first organic solvent.

22. The method of claim 19, which further comprises adding a hydrocarbyl chloride to the mixture before cooling the mixture.

23. The method of claim 22, wherein the additive is dissolved in an organic solvent miscible with the first organic solvent and then is added.

24. The method of claim 19, wherein the forming of the precipitate comprises cooling the mixture after completion of the reaction between the plurality of quantum dots and the polymer or adding a precipitation-inducing substance to the mixture.

25. The method of claim 24, wherein the precipitation-inducing substance comprises an organic zinc, a zinc salt, or a combination thereof.

26. The method of claim 19, which further comprises pulverizing the separated precipitate, and the pulverizing is performed at a temperature of greater than about 0° C. and less than or equal to 25° C.

27. An electronic device comprising the quantum dot-polymer micronized composite of claim 1.

* * * * *